United States Patent
Korai et al.

(10) Patent No.: US 10,040,887 B2
(45) Date of Patent: Aug. 7, 2018

(54) COPOLYMER, ORGANIC LIGHT-EMITTING DEVICE MATERIAL INCLUDING THE SAME, AND ORGANIC LIGHT-EMITTING DEVICE INCLUDING THE ORGANIC LIGHT-EMITTING DEVICE MATERIAL

(71) Applicant: SAMSUNG ELECTRONICS CO., LTD., Suwon-si, Gyeonggi-do (KR)

(72) Inventors: Keisuke Korai, Yokohama (JP); Mitsunori Ito, Yokohama (JP)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/388,925

(22) Filed: Dec. 22, 2016

(65) Prior Publication Data
US 2017/0183439 A1 Jun. 29, 2017

(30) Foreign Application Priority Data

Dec. 28, 2015 (JP) .................................. 2015-257422
Nov. 4, 2016 (KR) .......................... 10-2016-0146911

(51) Int. Cl.
*H01L 51/50* (2006.01)
*C08F 226/12* (2006.01)
*H01L 51/00* (2006.01)

(52) U.S. Cl.
CPC ........ *C08F 226/12* (2013.01); *H01L 51/0039* (2013.01); *H01L 51/0043* (2013.01); *H01L 51/5016* (2013.01); *H01L 51/5056* (2013.01)

(58) Field of Classification Search
None
See application file for complete search history.

(56) References Cited

U.S. PATENT DOCUMENTS 6,403,239 B2   6/2002   Chen et al.
6,803,124 B2   10/2004   Taguchi
(Continued)

FOREIGN PATENT DOCUMENTS

JP   1995-090255 A   4/1995
JP   1996-054833 A   2/1996
(Continued)

OTHER PUBLICATIONS

Stephan et al., Blue light electroluminescent devices based on a copolymer derived from fluorene and carbazole, 1999, Synthetic Metals, 109, 115-119.*

(Continued)

*Primary Examiner* — Gregory D Clark
(74) *Attorney, Agent, or Firm* — Cantor Colburn LLP

(57) ABSTRACT

A copolymer including a unit represented by Formula 1 and a unit represented by Formula 2:

Formula 1

(Continued)

-continued

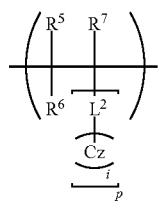

Formula 2 wherein, in Formulae 1 and 2, groups and variables are the same as described in the specification.

20 Claims, 1 Drawing Sheet

(56) References Cited

U.S. PATENT DOCUMENTS

| | | |
|---|---|---|
| 2008/0145705 A1 | 6/2008 | Narihiro et al. |
| 2008/0154005 A1 | 6/2008 | Suzuki et al. |
| 2015/0280131 A1 | 10/2015 | Yomogita et al. |

FOREIGN PATENT DOCUMENTS

| | | | |
|---|---|---|---|
| JP | 1996-269133 A | 10/1996 | |
| JP | 2001-098023 A | 4/2001 | |
| JP | 2002-110359 A | 4/2002 | |
| JP | 2002-363227 A | 12/2002 | |
| JP | 2003-313240 A | 11/2003 | |
| JP | 2004-059743 A | 2/2004 | |
| JP | 2004-303490 A | 10/2004 | |
| JP | 2006-237592 A | 9/2006 | |
| JP | 2008-198989 A | 8/2008 | |
| JP | 2008-218983 A | 9/2008 | |
| JP | 2012-188637 * | 4/2012 | ............ H01L 51/50 |
| WO | 2005-022961 A1 | 3/2005 | |
| WO | 2014-057852 A1 | 4/2014 | |

OTHER PUBLICATIONS

G. Krucaite et al. "Electro-active oligomers containing pendent 3-henylcarbazol-6-yl or 2-phenylfluoren-7-yl fragments as materials for OLEDS", Optical Materials 37 (2014) 788-792.

* cited by examiner

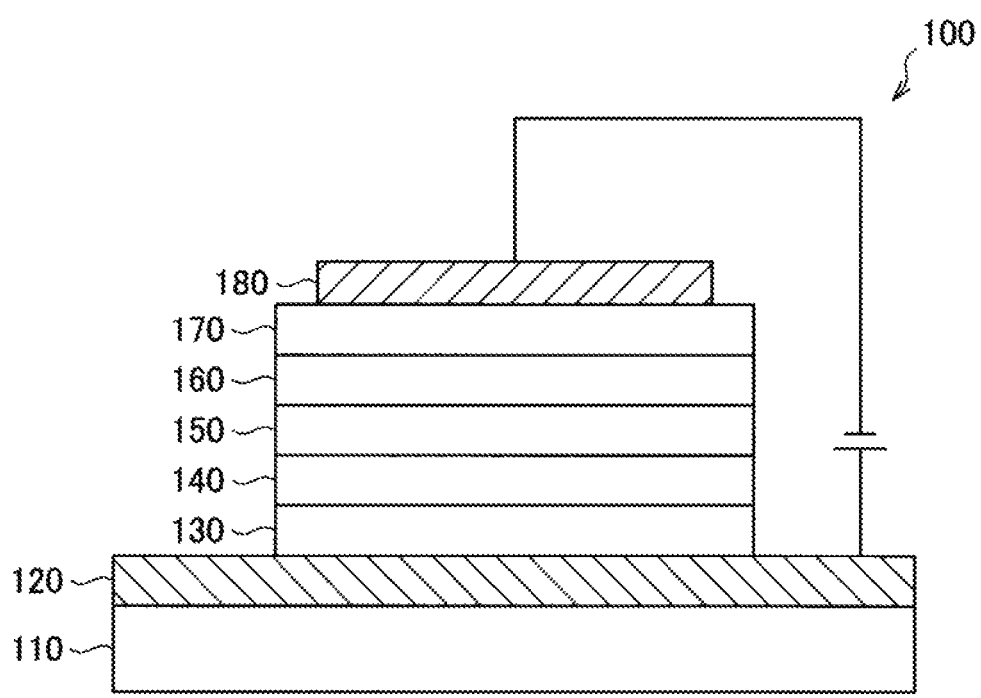

COPOLYMER, ORGANIC LIGHT-EMITTING DEVICE MATERIAL INCLUDING THE SAME, AND ORGANIC LIGHT-EMITTING DEVICE INCLUDING THE ORGANIC LIGHT-EMITTING DEVICE MATERIAL

CROSS-REFERENCE TO RELATED APPLICATION

This application claims priority to Japanese Patent Application No. 2015-257422, filed on Dec. 28, 2015, in the Japan Patent Office, and Korean Patent Application No. 10-2016-0146911, filed on Nov. 4, 2016, in the Korean Intellectual Property Office, and all the benefits accruing therefrom under 35 U.S.C. § 119, the contents of which are incorporated herein in their entirety by reference.

BACKGROUND

1. Field

The present disclosure relates to a copolymer, an organic light-emitting device material including the copolymer, and an organic light-emitting device including the organic light-emitting device material.

2. Description of the Related Art

Recently, there has been active development of materials for organic light-emitting devices known as a self-light emitting devices, and display devices and lighting fixtures using organic light-emitting devices.

Manufacture of a larger-area organic light-emitting device at a reduced cost, using a solution coating method instead of vacuum deposition has been considered. The solution coating method may have a higher material utilization efficiency and may ensure easy formation of a large-area film without a need for a high-cost vacuum deposition process, as compared with the vacuum deposition method. Accordingly, the solution coating method is expected to be a more efficient method of manufacturing organic light-emitting devices.

SUMMARY

Provided are a copolymer having a novel structure that may improve the emission lifespan of an organic light-emitting device, an organic light-emitting device material including the copolymer, and an organic light-emitting device using the organic light-emitting device material.

Additional aspects will be set forth in part in the description which follows and, in part, will be apparent from the description, or may be learned by practice of the presented embodiments.

According to an aspect of an embodiment, a copolymer includes a unit represented by Formula 1 and a unit represented by Formula 2:

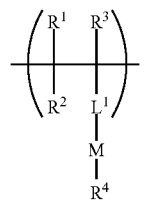

Formula 1

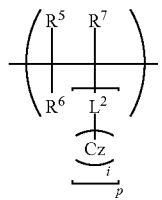

Formula 2 wherein, in Formulae 1 and 2, $R^1$ to $R^7$ may each independently be selected from a hydrogen, a deuterium, a halogen atom, a hydroxyl group, an amino group, a nitro group, a cyano group; a substituted or unsubstituted silyl group; a substituted or unsubstituted C1-C20 alkyl group; a substituted or unsubstituted C3-C16 cyclo alkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; and a substituted or unsubstituted C6-C30 arylamino group, $L^1$ may be selected from a single bond, a substituted or unsubstituted C1-C20 alkylene group; a substituted or unsubstituted C3-C30 cycloalkylene group; a substituted or unsubstituted C10-C30 arylene group; a substituted or unsubstituted C1-C30 heteroarylene group; a substituted or unsubstituted divalent alkylamino group; a substituted or unsubstituted divalent arylamino group, and a combination thereof, $L^2$ may be selected from a single bond, a substituted or unsubstituted C1-C20 alkylene group; a substituted or unsubstituted C3-C30 cycloalkylene group; a substituted or unsubstituted C6-C30 arylene group; a substituted or unsubstituted C1-C30 heteroarylene group; a substituted or unsubstituted divalent alkylamino group; a substituted or unsubstituted divalent arylamino group, and a combination thereof, Cz may be a group including a carbazole ring system or aza carbazole ring system, i may be an integer from 1 to 20, M may be a group represented by $-(A-B)_n-A_m-$ or $-(B-A)_n-B_m-$, n may be an integer from 1 to 20, m may be an integer from 0 to 10, p may be an integer from 1 to 10, A may be a group including a fluorene ring system or an aza fluorene ring system, and B may be a group represented by Formula 3,

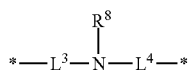

Formula 3 wherein, in Formula 3, $L^3$ and $L^4$ may each independently be selected from a single bond, a substituted or unsubstituted C1-C20 alkylene group; a substituted or unsubstituted C3-C16 cycloalkylene group; a substituted or unsubstituted C6-C30 arylene group; a substituted or unsubstituted C1-C20 oxyalkylene group; a substituted or unsubstituted C3-C16 oxycycloalkylene group; a substituted or unsubstituted C6-C30 oxyarylene group; a substituted or unsubstituted C7-C40 aralkyl arylene group; a substituted or unsubstituted C6-C30 amino arylene group; a silylene group substituted with a C1-C20 alkyl group; a silylene group substituted with a C6-C30 aryl group, and a combination thereof, $R^9$ may be selected from a hydrogen, a substituted or unsubstituted C1-C20 alkyl group; a substituted or unsubstituted C3-C16 cycloalkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; and a substituted or unsubstituted C6-C30 arylamino group, wherein $R^8$ may optionally form a ring by binding with $L^3$ or $L^4$, and

* may be a binding site with an adjacent atom. The copolymer may improve the emission lifespan of an organic light-emitting device.

In some embodiments, A in M of Formula 1 may be a group represented by Formula 4, in which any two of $R^9$ to $R^{12}$ may be bound to adjacent atoms:

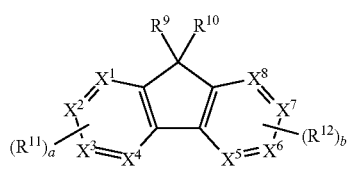

Formula 4 wherein, in Formula 4, $R^9$ to $R^{12}$ may each independently be selected from a hydrogen, a halogen atom, a hydroxyl group, an amino group, a nitro group, a cyano group; a substituted or unsubstituted silyl group; a substituted or unsubstituted C1-C20 alkyl group; a substituted or unsubstituted C3-C16 cycloalkyl group; a substituted or unsubstituted C6-C30 aryl group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; a substituted or unsubstituted C6-C30 arylamino group, and a substituted or unsubstituted C6-C30 arylsulfonyl group, wherein any two adjacent groups selected from $R^9$ to $R^{12}$ may optionally form a ring, a and b may each independently be an integer from 1 to 4, and $X^1$ to $X^8$ may each independently be CH or N. The copolymer may improve the emission lifespan of an organic light-emitting device.

In some embodiments, $X^1$ to $X^9$ may each independently be CH or N. The copolymer may improve the lifespan of an organic light-emitting device.

In some embodiments, Cz may be represented by Formula 5. Any two of $R^{13}$ to $R^{15}$ in Formula 5 may be bound to an adjacent atom:

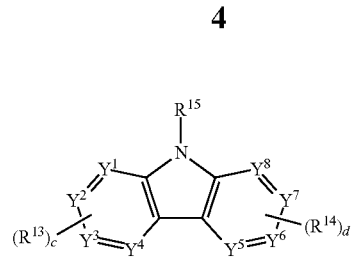

Formula 5 wherein, in Formula 5, $Y^1$ to $Y^8$ may each independently be CH or N, $R^{13}$ to $R^{15}$ may each independently be a hydrogen, a halogen atom, a hydroxyl group, an amino group, a nitro group, a cyano group; a substituted or unsubstituted silyl group; a substituted or unsubstituted C1-C20 alkyl group; a substituted or unsubstituted C1-C20 amino alkyl group; a substituted or unsubstituted C3-C16 cycloalkyl group; a substituted or unsubstituted C6-C30 aryl group; a substituted or unsubstituted C6-C30 amino aryl group; a substituted or unsubstituted C1-C30 heteroaryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C2-C40 heteroaralkyl group; a substituted or unsubstituted C1-C20 alkylamino group, or a substituted or unsubstituted C6-C30 arylamino group, wherein any two adjacent groups selected from $R^{13}$ to $R^{15}$ may optionally form a ring, and c and d may each independently be an integer from 0 to 4.

In some embodiments, Cz may be represented by Formula 6 or Formula 7, and any one of $R^{13}$ and $R^{14}$ may be bound to an adjacent atom:

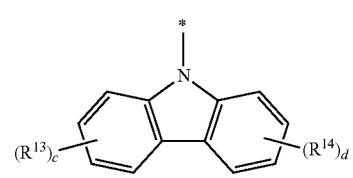

Formula 6

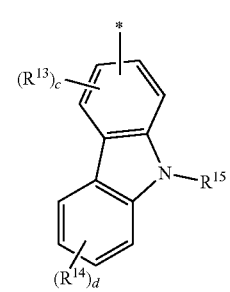

Formula 7

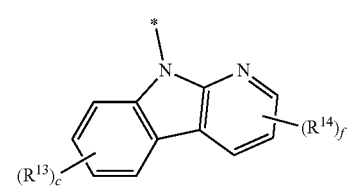

Formula 8

-continued

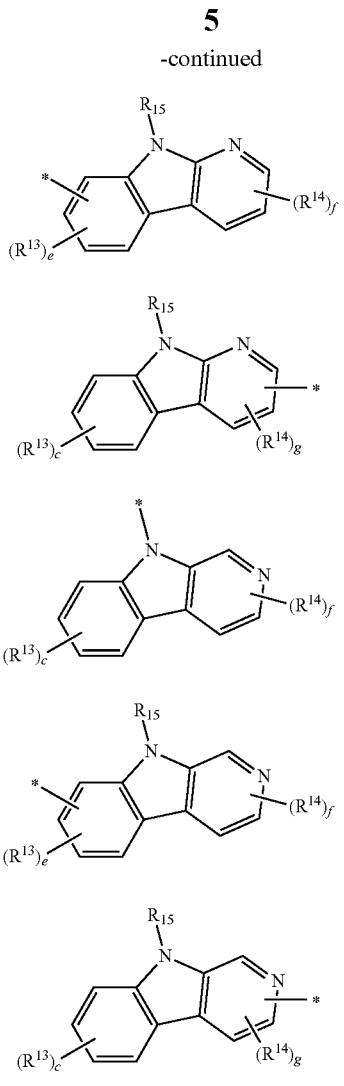

Formula 9

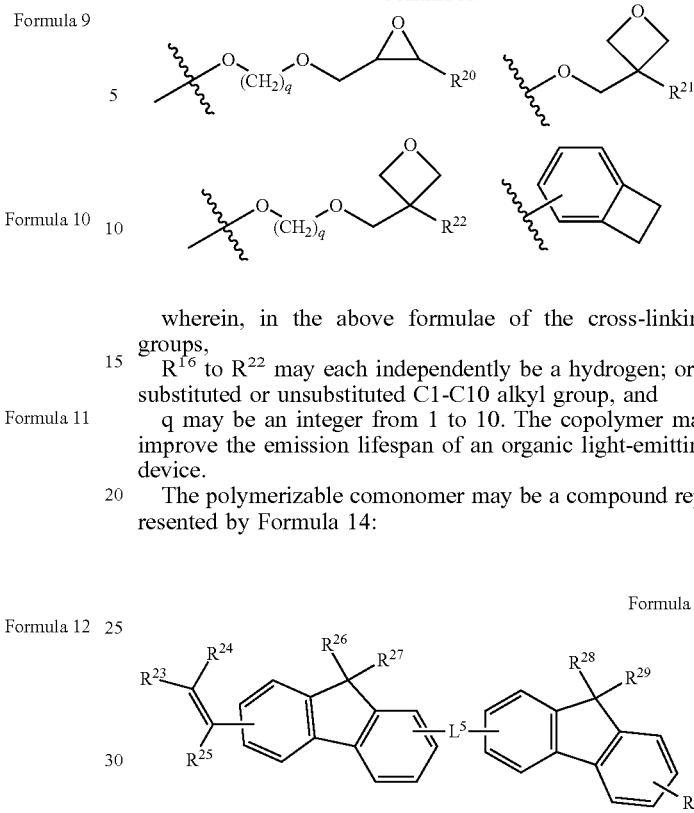

Formula 10

Formula 11

Formula 12

Formula 13 wherein, in the above formulae of the cross-linking groups, $R^{16}$ to $R^{22}$ may each independently be a hydrogen; or a substituted or unsubstituted C1-C10 alkyl group, and q may be an integer from 1 to 10. The copolymer may improve the emission lifespan of an organic light-emitting device.

The polymerizable comonomer may be a compound represented by Formula 14:

Formula 14 wherein, in Formula 14, $R^{23}$ to $R^{25}$ may each independently be selected from a hydrogen; a substituted or unsubstituted C1-C10 alkyl group; and a substituted or unsubstituted C6-C30 aryl group, $R^{26}$ to $R^{30}$ may each independently be selected from a hydrogen, a halogen atom, a hydroxyl group, an amino group, a nitro group, a cyano group; a substituted or unsubstituted silyl group; a substituted or unsubstituted C1-C10 alkyl group; a substituted or unsubstituted C3-C16 cycloalkyl group; a substituted or unsubstituted C6-C30 aryl group; a substituted or unsubstituted C1-C20 alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C1-C20 alkylamino group, and a substituted or unsubstituted C6-C30 arylamino group, wherein any two adjacent groups selected from $R^{26}$ to $R^{30}$ may optionally form a ring, $L^5$ may be selected from a single bond, a substituted or unsubstituted C1-C20 alkylene group; a substituted or unsubstituted C3-C16 cycloalkylene group; a substituted or unsubstituted C6-C30 arylene group; a substituted or unsubstituted C1-C20 oxyalkylene group; a substituted or unsubstituted C3-C16 oxycycloalkylene group; a substituted or unsubstituted C6-C30 oxyarylene group; a substituted or unsubstituted C7-C40 aralkylene group; a substituted or unsubstituted C1-C30 heteroarylene group; a substituted or unsubstituted C6-C30 amino arylene group; a silylene group substituted with a C1-C20 alkyl group, a silylene group substituted with a C6-C30 aryl group, and a combination thereof, and at least one of $R^{26}$ to $R^{30}$ may be selected from the cross-linking groups. The copolymer may further improve the emission lifespan of an organic light-emitting device.

wherein, in Formula 6 to Formula 13, $R^{13}$ to $R^{15}$, c, and d may be the same as in Formula 5, e and f may each independently be an integer from 0 to 3, g may be an integer from 0 to 2, and

* may be a binding site with an adjacent atom.

In some embodiments, the copolymer may further include a polymerizable comonomer. The polymerizable comonomer may include at least one of cross-linking groups represented by the following formulae:

Cross-Linking Groups

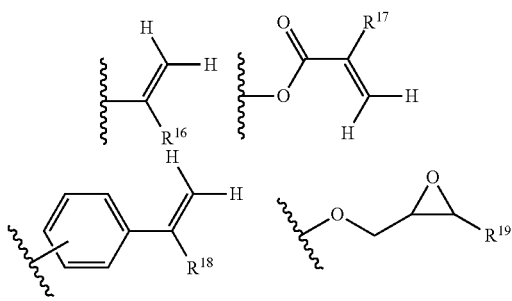

In some embodiments L⁵ may be a group represented by Formula 15:

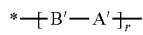
Formula 15 wherein, in Formula 15,
A' may be represented by Formula 3, and
B' may include a fluorene ring system or an aza fluorene ring system,
r is an integer from 1 to 20, and
* may be a binding site with an adjacent atom.

In some embodiments, L⁵ may be a group represented by Formula 3. The copolymer may further improve the emission lifespan of an organic light-emitting device.

According to an aspect of another embodiment, an organic light-emitting device includes:
a first electrode;
a second electrode; and
an organic layer disposed between the first electrode and the second electrode,
wherein the organic layer includes the copolymer of any one of the above-described embodiments. The organic light-emitting device may have improved lifespan.

In some embodiments, the organic layer may include at least one layer, and the at least one layer is a hole transport layer including the copolymer. The organic layer may further include at least one layer including a light-emitting material which ensures emission from triplet excitons. The organic light-emitting device may have improved emission lifespan.

According to an aspect of another embodiment, an organic light-emitting device material includes the copolymer of any one of the above-described embodiments. The organic light-emitting device material may further include a solvent.

BRIEF DESCRIPTION OF THE DRAWINGS

These and/or other aspects will become apparent and more readily appreciated from the following description of the embodiments, taken in conjunction with the accompanying drawings in which:

FIG. 1 is a schematic view of an organic light-emitting device according to an embodiment.

DETAILED DESCRIPTION

Reference will now be made in detail to embodiments of a copolymer, an organic light-emitting device material including the copolymer, and an organic light-emitting device including the organic light-emitting device material, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present disclosure. As used herein, the term "and/or" includes any and all combinations of one or more of the associated listed items. Expressions such as "at least one of," when preceding a list of elements, modify the entire list of elements and do not modify the individual elements of the list.

It will be understood that when an element is referred to as being "on" another element, it can be directly in contact with the other element or intervening elements may be present therebetween. In contrast, when an element is referred to as being "directly on" another element, there are no intervening elements present.

It will be understood that, although the terms first, second, third etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of the present embodiments.

The terminology used herein is for the purpose of describing particular embodiments only and is not intended to be limiting. As used herein, the singular forms "a," "an," and "the" are intended to include the plural forms as well, unless the context clearly indicates otherwise.

The term "or" means "and/or." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this general inventive concept belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

As materials for organic light-emitting devices (hereinafter, also referred to as organic light-emitting device materials) that are compatible with a solution coating method, for example, low-molecular weight materials and high-molecular weight materials are currently being considered. Among these materials, high-molecular weight materials have a high coating uniformity and may easily form stacked layers, and thus are under vigorous development. In particular, such high-molecular weight materials are applicable to displays or lighting fixtures, development of polymer-based hole transport materials is expected.

For example, organic light-emitting device materials obtained by polymerization of low-molecular weight materials through partial substitution of the low-molecular weight material with a vinyl group are disclosed in the following documents:
JP1995-090255
JP1996-054833
JP1996-269133
JP2001-098023
JP2002-110359
JP2003-313240
JP2004-059743
JP2006-237592
JP2008-198989
JP2008-218983.

However, organic light-emitting devices manufactured using the organic light-emitting devices materials disclosed in the above-identified documents by the solution coating method may have insufficient emission lifespan.

Therefore, to address this drawback, the present disclosure provides a copolymer having a novel structure that may improve the emission lifespan of an organic light-emitting device, an organic light-emitting device material including the copolymer, and an organic light-emitting device including the organic light-emitting device material.

Copolymer

According to an aspect of the present disclosure, a copolymer includes a unit represented by Formula 1 (hereinafter, also referred to as "aminofluorene unit") and a unit represented by Formula 2 (hereinafter, also referred to as "carbazole unit").

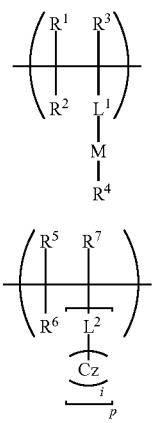

Formula 1

Formula 2 wherein, in Formulae 1 and 2,
$R^1$ to $R^7$ may each independently be selected from a hydrogen, a deuterium, a halogen atom, a hydroxyl group, an amino group, a nitro group, a cyano group; a substituted or unsubstituted silyl group; a substituted or unsubstituted C1-C20 alkyl group; a substituted or unsubstituted C3-C16 cyclo alkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; and a substituted or unsubstituted C6-C30 arylamino group, $L^1$ may be selected from a single bond, a substituted or unsubstituted C1-C20 alkylene group; a substituted or unsubstituted C3-C30 cycloalkylene group; a substituted or unsubstituted C10-C30 arylene group; a substituted or unsubstituted C1-C30 heteroarylene group; a substituted or unsubstituted divalent alkylamino group; a substituted or unsubstituted divalent arylamino group, and a combination thereof, $L^2$ may be selected from a single bond, a substituted or unsubstituted C1-C20 alkylene group; a substituted or unsubstituted C3-C30 cycloalkylene group; a substituted or unsubstituted C6-C30 arylene group; a substituted or unsubstituted C1-C30 heteroarylene group; a substituted or unsubstituted divalent alkylamino group; a substituted or unsubstituted divalent arylamino group, and a combination thereof, when $L^1$ is an arylene group, the arylene group may be a C10-C30 arylene group, Cz may be a group including a carbazole ring system or an aza carbazole ring system, i may be an integer from 1 to 20, M may be a group represented by $-(A-B)_n-A_m-$ or $-(B-A)_n-B_m-$, n may be an integer from 1 to 20, m may be an integer from 0 to 10, p may be an integer from 1 to 10, A may be a group including a fluorene ring system or an aza fluorene ring system, and B may be a group represented by Formula 3,

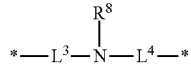

Formula 3 wherein, in Formula 3,
$L^3$ and $L^4$ may each independently be selected from a single bond, a substituted or unsubstituted C1-C20 alkylene group; a substituted or unsubstituted C3-C16 cycloalkylene group; a substituted or unsubstituted C6-C30 arylene group; a substituted or unsubstituted C1-C20 oxyalkylene group; a substituted or unsubstituted C3-C16 oxycycloalkylene group; a substituted or unsubstituted C6-C30 oxyarylene group; a substituted or unsubstituted C7-C40 aralkyl arylene group; a substituted or unsubstituted C6-C30 amino arylene group; a silylene group substituted with a C1-C20 alkyl group; a silylene group substituted with a C6-C30 aryl group, and a combination thereof, $R^8$ may be selected from a hydrogen, a substituted or unsubstituted C1-C20 alkyl group; a substituted or unsubstituted C3-C16 cycloalkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; and a substituted or unsubstituted C6-C30 arylamino group, wherein $R^8$ may optionally form a ring by binding with $L^3$ or $L^4$, and \* may be a binding site with an adjacent atom.

In some embodiments, when used in an organic light-emitting device, the copolymer may improve the emission lifespan. For example, the carbazole unit of the copolymer may contribute to increasing a glass transition temperature of the copolymer. Accordingly, the copolymer may have a high glass transition temperature, and thus, improved thermal stability. Therefore, an organic light-emitting device including the copolymer may be stable against heat generated during the operation. Thus, deterioration and deformation of the organic light-emitting device caused by the operating heat may be suppressed, so that the organic light-emitting device including the copolymer may have improved emission lifespan, as compared with conventional organic light-emitting devices.

Since the copolymer has a high glass transition temperature, denaturation or deformation of the copolymer by heat may not occur during solution coating. Furthermore, a layer formed from the copolymer may be insoluble in a solvent that is used to form another layer, so that the copolymer may be suitable to form stacked layers by a solution coating method.

An organic layer formed from the copolymer by a solution coating method may have no stains and may have a uniform thickness. Furthermore, the organic layer may have a planar surface, so that staining of the organic layer may be suppressed during application of a driving voltage or light emission.

In detail, a carbon-carbon bond dissociation energy of a vinyl polymer in the cation radical state may be about 3 times higher than that of a vinyl polymer having a fluorenyl group at a polymerization site. Therefore, the copolymer according to an embodiment including a fluorenyl group at a polymerization site may be chemically stable, so that an organic light-emitting device including the copolymer may have improved emission lifespan.

The copolymer may have improved hole transport ability and improved hole injection ability. Therefore, the copolymer may be suitable for use as a hole transport material, a hole injection material, or a host material of an emission layer.

Hereinafter, the units of the copolymer according to an embodiment will now be described.

Aminofluorene Unit

The aminofluorene unit represented by Formula 1 is described below.

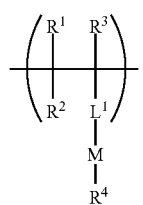

Formula 1

In Formula 1 of the aminofluorene unit, $R^1$ to $R^4$ may each independently be selected from a hydrogen, a deuterium, a halogen atom, a hydroxyl group, an amino group, a nitro group, a cyano group; a substituted or unsubstituted silyl group; a substituted or unsubstituted C1-C20 alkyl group; a substituted or unsubstituted C3-C16 cyclo alkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C7-C40 aryloxy group; a substituted or unsubstituted C1-C30 heteroaryl group; a substituted or unsubstituted C1-C20 alkylamino group, and a substituted or unsubstituted C6-C30 arylamino group.

As used herein, the term "aza carbazole" is construed to include any and all compounds, in which at least one carbon of the carbazole ring system is replaced with nitrogen.

As used herein, the term "aza fluorine" is construed to include any and all compounds, in which at least one carbon in the fluorene ring system is replaced with nitrogen.

As used herein, the "hydrogen" is construed to also include deuterium, unless this term is recited together with "deuterium". In addition, hydrogens in each substituent may also be interchangeable with deuterium, unless explicitly described to exclude deuterium.

As used herein, the "alkyl group" may be a linear or branched alkyl group. The linear or branched alkyl group is not specifically limited, and may be, for example, a linear alkyl group such as a methyl group, an ethyl group, a propyl group, a butyl group, an octyl group, a decyl group, and a pentadecyl group, or a branched alkyl group such as am iso-propyl group or a tert-butyl group (t-butyl group). For example, the number of carbon atoms of the linear or branched alkyl group may be 1 to 15, and in some embodiments, 1 to 10, and in some other embodiments, 2 to 9.

As used herein, the "cycloalkyl group" may be a monocyclic hydrocarbon group such as cyclobutyl group, a cyclopentyl group, a cyclohexyl group, and a cycloheptyl group, or may be a bridged hydrocarbon group such as a bicycloalkyl group and tricycloalkyl group. The number of carbon atoms of the cycloalkyl group is not specifically limited, and may be, for example, 3 to 12, and in some embodiments, 3 to 10, and in some other embodiments, 4 to 7.

As used herein, the "aryl group" may be, for example, a monocyclic aromatic group such as a phenyl group, or a condensed polycyclic aromatic group such as a biphenyl group, a terphenyl group, a quaterphenyl group, a quinquephenyl group, a fluorenyl group, a fluoranthenyl group, a triperylenyl group, a naphthyl group, an anthracenyl group, an indenyl group, a pyrenyl group, and an acenaphthenyl group. For example, the number of carbon atoms of the aryl group may be 6 to 18, and in some embodiments, 6 to 12.

As used herein, the "heteroaryl group" may be a polycyclic heteroaryl group, for example, a pyrrolyl group, an imidazolyl group, a pyrazolyl group, an oxazolyl group, an isoxazolyl group, an oxadiazolyl group, a thiazolyl group, a furanyl group, a pyranyl group, a thienyl group, a pyridyl group, a pyrazyl group, a pyrimidinyl group, a pyridazinyl group, a triazinyl group, a quinolinyl group, an isoquinolinyl group, a benzofuranyl group, a benzothienyl group, an indolyl group, a carbazolyl group, a carbolinyl group, a phenanthridinyl group, an acridinyl group, a phenanthrolinyl group, a benzoxazolyl group, a benzothiazolyl group, a quinoxalinyl group, a benzimidazolyl group, a pyrazolyl group, a dibenzofuranyl group, and a dibenzothiophenyl group. For example, the number of carbon atoms of the heteroaryl group may be 3 to 24, and in some embodiments, 5 to 12.

As used herein, the "halogen atom" may be, for example, a fluorine atom, a chlorine atom, a bromine atom, or an iodine atom.

As used herein, the "alkoxy group", "cyclo alkoxy group", and "aryl alkoxy group" may refer to an alkyl group, a cyclo alkyl group, and an aryl alkyl group, respectively, each of which has an oxygen atom at a binding site with another group.

As used herein, the "alkylamino group" and the term "arylamino group" may be, for example, an amino group substituted with one, two, or three of the above-described alkyl groups and aryl groups, respectively.

As used herein, the "aralkyl group" refers to an alkyl group substituted with at least one of the above-described aryl groups.

As used herein, the "heteroaralkyl group" refers to an alkyl group substituted with at least one of the above-described heteroaryl groups.

Substituents of each of the above-described groups are not specifically limited. For example, the substituents may include a cyano group, a silyl group, a C1-C10 mono-, di-, or tri-alkylsilyl group, a C1-C10 linear or branched alkyl group, a C1-C10 linear or branched alkoxy group, a C6-C15 aryl group, a C6-C15 aryloxy group, a C6-C14 aryl carbonyl group, a C1-C32 heterocycloalkyl group, and a C6-C15 mono- or di-arylamino group. When the expression "substituted" is simply used, it may be construed as being substituted with these substituents unless stated otherwise.

For example, $R^1$ to $R^3$ may each independently be a hydrogen or a substituted or unsubstituted C1-C20 alkyl group, and in some embodiments, a hydrogen or a unsubstituted C1-C5 alkyl group, and in some other embodiments, a hydrogen.

In some embodiments, $R^4$ may be a hydrogen, a substituted or unsubstituted C1-C20 alkyl group; a substituted or unsubstituted C3-C16 cycloalkyl group; or a substituted or unsubstituted C6-C30 aryl group.

In some embodiments, $R^4$ may be a hydrogen or unsubstituted C1-C20 alkyl group, and in some other embodiments, a hydrogen or unsubstituted C1-C5 alkyl group.

In some embodiments, $L^1$ may be the same as described above.

The "alkylene group" may be, for example, a C1-C20 linear or branched alkylene group, and in some embodiments, a C1-C10 linear or branched alkylene group, and in some other embodiments, a C1-C3 linear or branched alkylene group. Examples of the alkylene group are a methylene group, an ethylene group, an n-propylene group, and an n-butylene group.

The "arylene group" may be, for example, a phenylene group, a biphenylene group, a terphenylene group, or a naphthylene group. The number of carbon atoms of the arylene group may be, for example, 6 to 30, 6 to 24, or 6 to 12.

The "cycloalkylene group" may be, for example, a polycyclic group such as a cyclopropylene group, a cyclobutylene group, a cyclopentylene group, a cyclohexylene group, a decahydronaphthalene group, or a bicyclo undecanylene group; or a bridged hydrocarbon group such as a bicycloalkylene group or a tricycloalkylene group. For example, the "cycloalkylene group" may be a norbonyl group. The number of carbon atoms of the cycloalkylene group may be, for example, 3 to 30, 3 to 24, or 3 to 12.

The "heteroarylene group" may be, for example, a bicyclic aromatic heteroarylene group, such as a pyrrolylene group, a thiophenylene group, a furanylene group, a pyrazolylene group, an imidazolylene group, an oxazolylene group, an isoxazolylene group, an oxadiazolylene group, a triazolylene group, a thiadiazolylene group, an isothiazolylene group, a pyridinylene group, a pyridazinylene group, a pyrimidinylene group, a pyrazinylene group, an indolylene group, an isoindolylene group, a benzothiophenylene group, an isobenzothiophenylene group, an indazolinylene group, an imidazopyridinylene group, a benzothiazolylene group, or a quinolinylene group. The number of carbon atoms of the heteroarylene group may be, for example, 1 to 30, 1 to 24, or 1 to 12.

When a group containing a specified number of carbon atoms is substituted with any of the groups listed in the preceding paragraphs, the number of carbon atoms in the resulting "substituted" group is defined as the sum of the carbon atoms contained in the original (unsubstituted) group and the carbon atoms (if any) contained in the substituent. For example, when the term "substituted C1-C30 alkyl" refers to a C1-C30 alkyl group substituted with C6-C30 aryl group, the total number of carbon atoms in the resulting aryl substituted alkyl group is C7-C60.

In some embodiments, in Formula 1, $X^1$ to $X^9$ may be —CH—.

In some embodiments, $R^9$ and $R^{10}$ may each independently be a hydrogen or a substituted or unsubstituted C1-C20 alkyl group.

In some embodiments, $X^1$ to $X^9$ may be —CH—, and $R^9$ and $R^{10}$ may each independently be a hydrogen or a substituted or unsubstituted C1-C20 alkyl group.

In some embodiments, $L^1$ may be selected from a single bond, a substituted or unsubstituted C5-C30 cycloalkylene group; a substituted or unsubstituted C10-C30 arylene group; and a substituted or unsubstituted C1-C30 heteroarylene group.

In some other embodiments, $L^1$ may be selected from a single bond, a substituted or unsubstituted C5-C30 cycloalkylene group; and a substituted or unsubstituted C1-C30 heteroarylene group.

In some other embodiments, $L^1$ may be a single bond or unsubstituted cycloalkylene group.

In some other embodiments, $L^1$ may be a single bond, a substituted or unsubstituted naphthylene group, or a substituted or unsubstituted norbornylene group.

In some other embodiments, $L^1$ may be a single bond, or a naphthylene group or norbornylene group.

For example, $L^1$ may be a single bond.

In some embodiments, M in Formula 1 may be a group represented by the formula -(A-B)$_n$-A$_m$- or a group represented by the formula -(B-A)$_n$-B$_m$-, as described above.

In some embodiments, A in the formula of M may be a group including a fluorene ring system or an aza fluorene ring system.

In some embodiments, A in the formula of M may be represented by Formula 4. In Formula 4, any two of groups $R^9$ to $R^{12}$ may be bound to adjacent atoms.

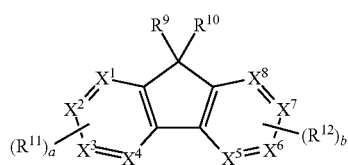

Formula 4

In some embodiments, $R^9$ and $R^{10}$ are not specifically limited to the above-described groups, and may each independently be a hydrogen, a substituted or unsubstituted C1-C20 alkyl group or a substituted or unsubstituted C6-C30 aryl group. In some embodiments, $R^9$ and $R^{10}$ may each independently be a hydrogen or unsubstituted C1-C12 alkyl group. The description of the alkyl group and aryl group provided above in connection with $R^1$ to $R^4$ may apply to the alkyl group and aryl group of $R^9$ and $R^{10}$.

In some embodiments, $R^{11}$ and $R^{12}$ are not specifically limited to the above-described groups, and may each independently be a hydrogen, a substituted or unsubstituted C1-C20 alkyl group; a substituted or unsubstituted C6-C30 aryl group; or a substituted or unsubstituted C1-C30 heteroaryl group. In some other embodiments, $R^{11}$ and $R^{12}$ may each independently be a hydrogen or a C1-C20 linear alkyl group. The description of the alkyl group and aryl group provided above in connection with $R^1$ to $R^4$ may apply to the alkyl group and aryl group of $R^{11}$ and $R^{12}$.

In some embodiments, when $R^{11}$ and $R^{12}$ each independently are an aryl group or a heteroaryl group, $R^{11}$ and $R^{12}$ may form a condensed ring by condensation with a fluorene ring system or an aza fluorene ring system in Formula 4.

In some embodiments, one of $X^1$ to $X^4$ may be N or none of $X^1$ to $X^4$ may be N. For example, all of $X^1$ to $X^4$ may be CH.

In some embodiments, one of $X^5$ to $X^8$ may be N, or none of $X^5$ to $X^8$ may be N. For example, all of $X^5$ to $X^8$ may be CH.

In some embodiments, a in Formula 4 may be an integer smaller than the number of CH groups of $X^1$ to $X^4$.

In some embodiments, b in Formula 4 may be an integer smaller than the number of CH groups of $X^5$ to $X^8$.

In some embodiments, $X^1$ to $X^8$ may be CH.

In some embodiments, $R^9$ and $R^{19}$ may each independently be a hydrogen or a substituted or unsubstituted C1-C20 alkyl group.

In some embodiments, $X^1$ to $X^8$ may be CH, and $R^9$ and $R^{19}$ may each independently be a hydrogen or a substituted or unsubstituted C1-C20 alkyl group.

In some embodiments, the group represented by Formula 4 may be one selected from the structures represented by the following formulae, wherein a hydrogen in each of the structures may be substituted with substituents.

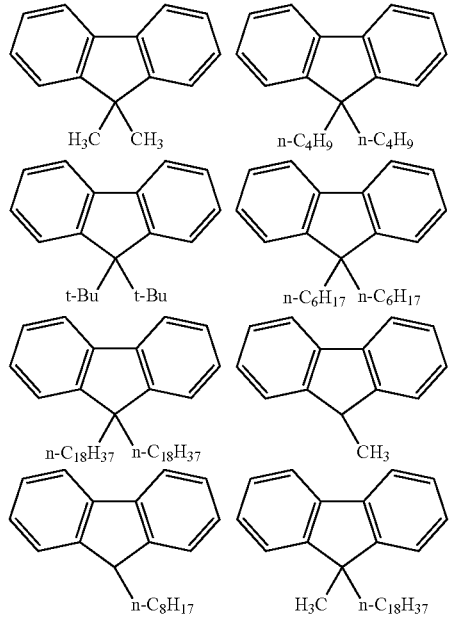

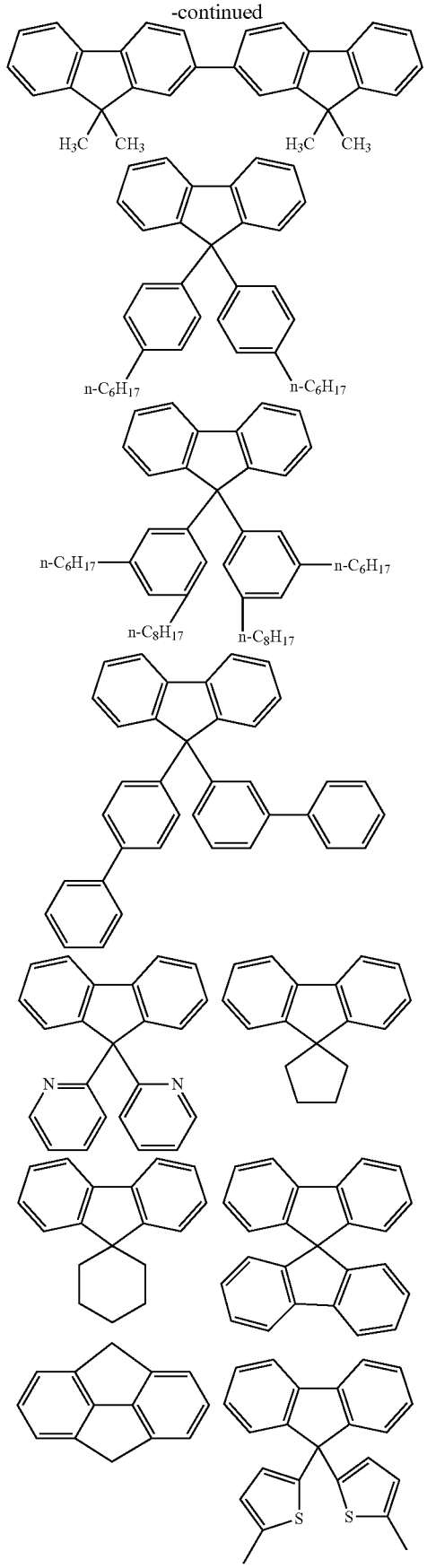

-continued

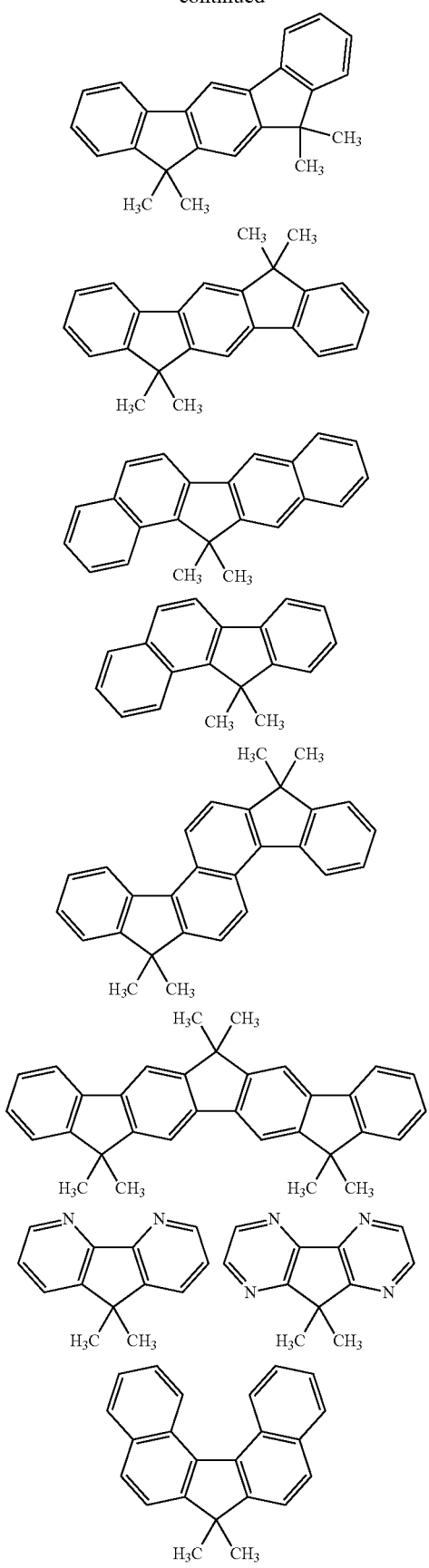

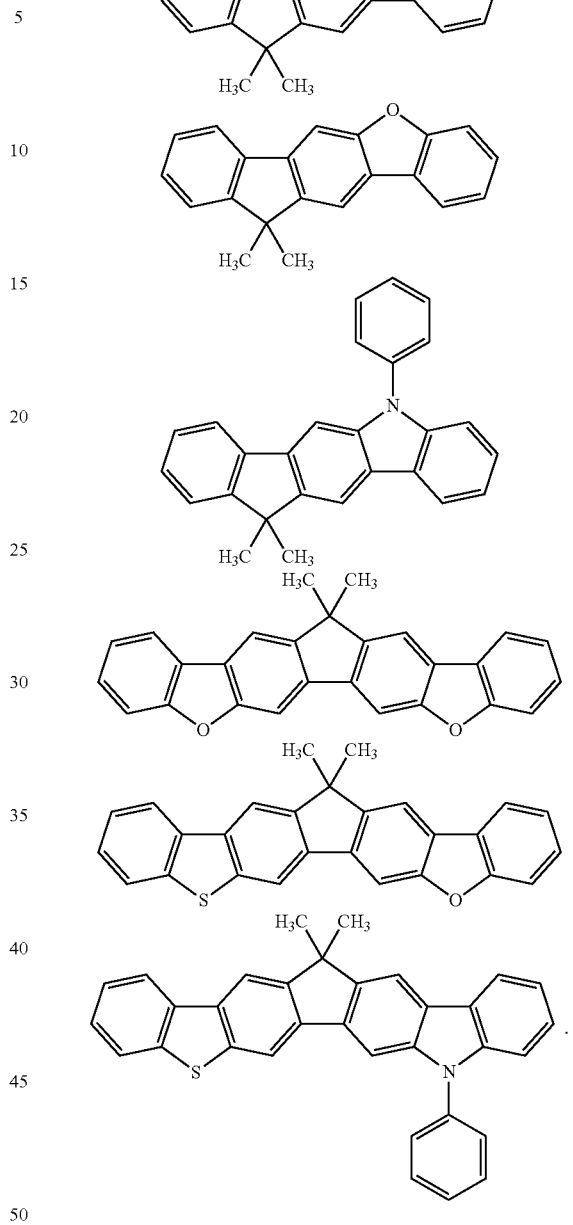

In some embodiments, B in the formula of M may be a group represented by Formula 3.

$$*-L^3-\underset{\underset{R^8}{|}}{N}-L^4-*$$

Formula 3

In some embodiments, $L^3$ and $L^4$ are not specifically limited to the above-described groups, and may each independently be a single bond, or a substituted or unsubstituted C6-C30 arylene group. In some embodiments, $L^3$ and $L^4$ may each independently be a single bond, a phenylene group, a biphenylene group, or a naphthylene group. In some embodiments, $L^3$ and $L^4$ may each independently be a single bond.

In some embodiments, one of $L^3$ and $L^4$ may be a single bond, and the remaining one of $L^3$ and $L^4$ may be a substituted or unsubstituted C6-C30 arylene group.

In some embodiments, $R^8$ is not specifically limited to the above-described groups, and may be, for example, a hydrogen, a substituted or unsubstituted C1-C2 alkyl group, or a substituted or unsubstituted C6-C30 aryl group. In some embodiments, $R^8$ may be a C6-C12 aryl group substituted with an alkyl group. The description of the alkyl group and aryl group provided above in connection with $R^1$ to $R^4$ may apply to the alkyl group and aryl group of $R^8$.

In some embodiments, the C6 to 30 aryl group substituted with an alkyl group may be a methylphenyl group or an ethylphenyl group.

In some embodiments, in Formula 4, n may be an integer from 1 to 20, for example, an integer from 1 to 10, or an integer from 1 to 5. In some embodiments, in Formula 4, n may be 1 or 2.

In some embodiments, the unit represented by Formula 1 may be selected from the structures represented by the following formulae, but is not limited thereto.

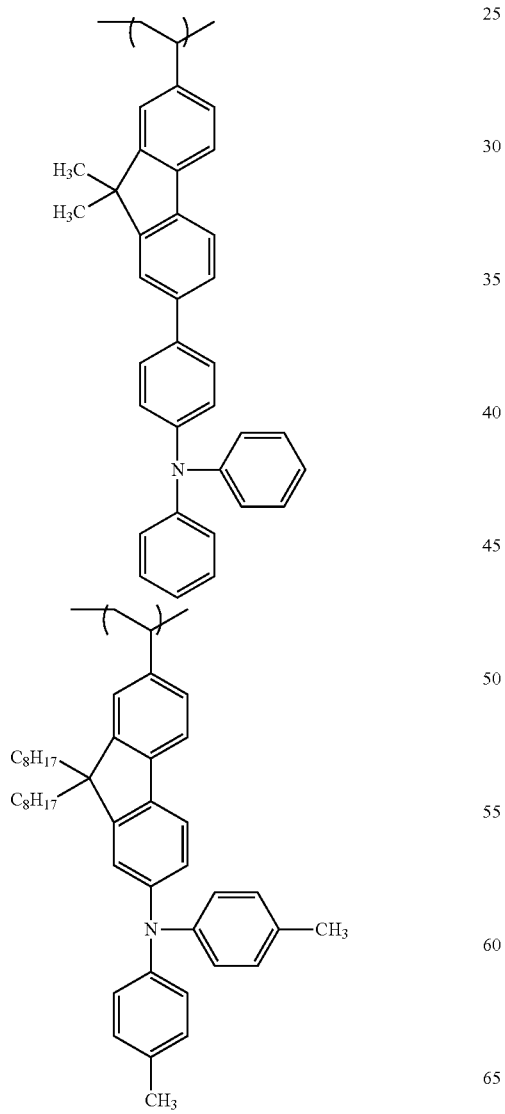

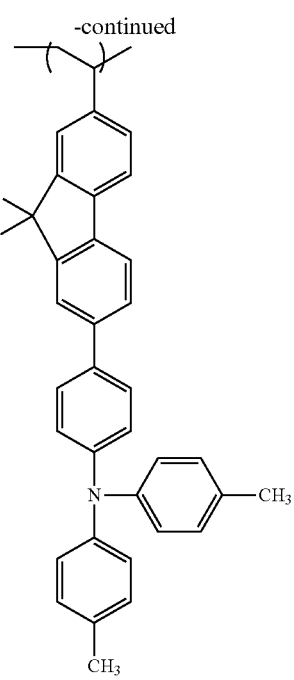

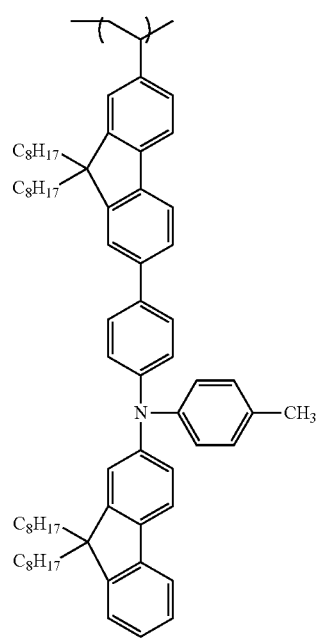

21
-continued
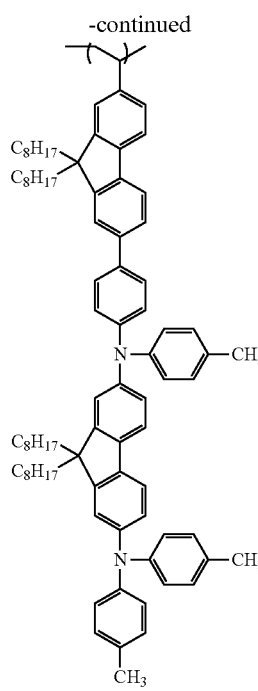
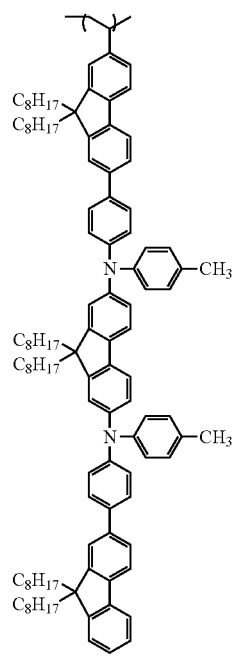
22
-continued
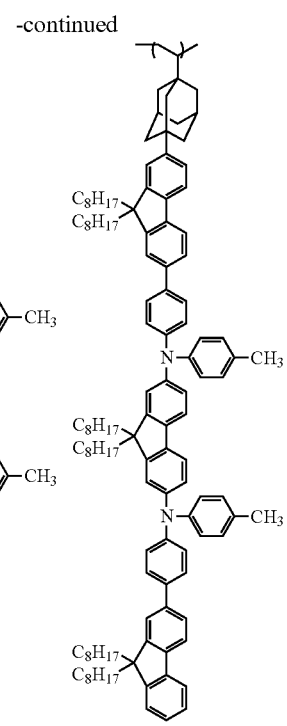
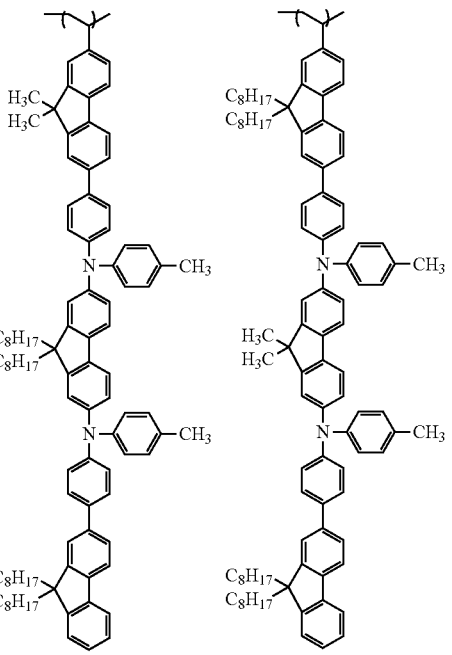

-continued

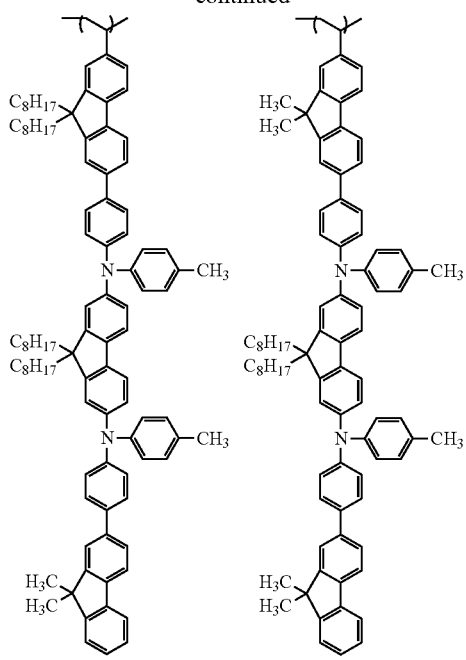
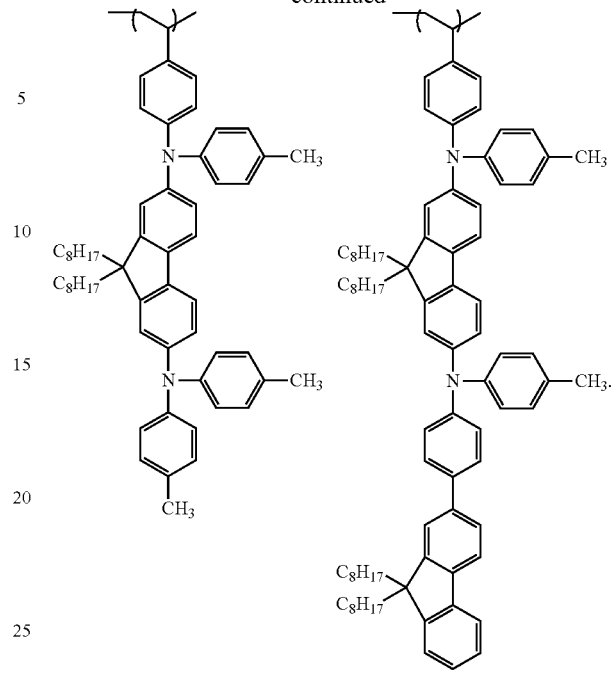

Carbazole Unit

Hereinafter, the carbazole unit represented by Formula 2 will now be described in detail.

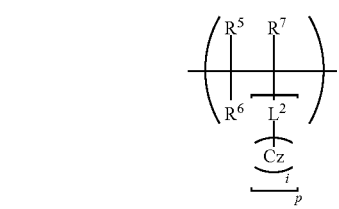

Formula 2

In some embodiments, $R^5$ to $R^7$ may be the same as $R^1$ to $R^4$ described above.

In some embodiments, the carbazole unit represented by Formula 2 may be a chain group in which $L^2$ and Cz are alternately polymerized, wherein the number of each of the groups $L^2$ and Cz may be p.

In some embodiments, $L^2$ may be a single bond, a substituted or unsubstituted C5-C30 cycloalkylene group, a substituted or unsubstituted C6-C30 arylene group, or a substituted or unsubstituted C1-C30 heteroarylene group.

In some embodiments, $L^2$ may be selected from a single bond, a substituted or unsubstituted C5-C30 cycloalkylene group, and a substituted or unsubstituted C1-C30 heteroarylene group.

In some other embodiments, $L^2$ may be a single bond, a substituted or unsubstituted phenylene group, or a substituted or unsubstituted fluorenylene group.

In some other embodiments, $L^2$ may be a single bond, a phenylene group, or a fluorenylene group substituted with an alkyl group.

In some embodiments, $L^2$ may be a single bond.

In some embodiments, Cz may be a carbazole ring system or an aza carbazole ring system. For example, Cz may be represented by Formula 5. In Formula 5, two of $R^{13}$ to $R^{15}$ may be bound to adjacent atoms.

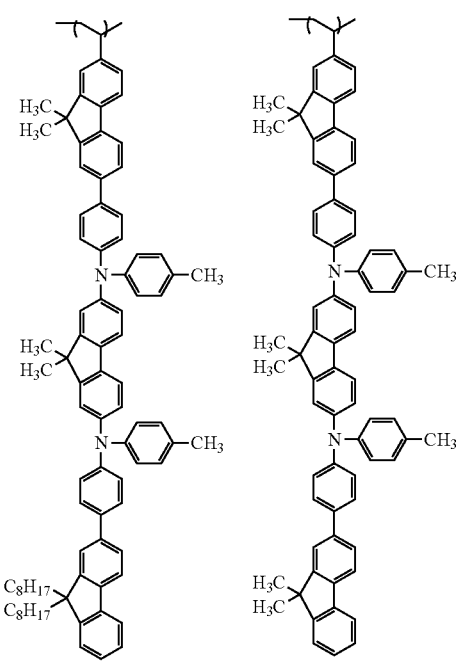

Formula 5

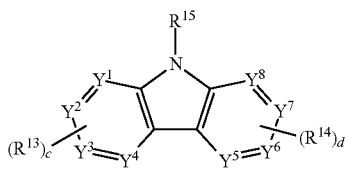

In Formula 5,
$Y^1$ to $Y^8$ may each independently be CH or N,
$R^{13}$ to $R^{15}$ may each independently be a hydrogen, a halogen atom, a hydroxyl group, an amino group, a nitro group, a cyano group, a substituted or unsubstituted silyl group, a substituted or unsubstituted C1-C20 alkyl group, a substituted or unsubstituted C1-C20 amino alkyl group, a substituted or unsubstituted C3-C16 cycloalkyl group, a substituted or unsubstituted C6-C30 aryl group, a substituted or unsubstituted C6-C30 amino aryl group, a substituted or unsubstituted C1-C30 heteroaryl group, a substituted or unsubstituted C1-C20 alkoxy group, a substituted or unsubstituted C3-C16 cyclo alkoxy group, a substituted or unsubstituted C6-C30 aryloxy group, a substituted or unsubstituted C7-C40 aralkyl group, a substituted or unsubstituted C2-C40 heteroaralkyl group; a substituted or unsubstituted C1-C20 alkylamino group, or a substituted or unsubstituted C6-C60 arylamino group; wherein any two adjacent groups selected from $R^{13}$ to $R^{15}$ may optionally form a ring, and
c and d may each independently an integer from 0 to 4.

In some embodiments, one of $Y^1$ to $Y^4$ may be N, or none of $Y^1$ to $Y^4$ may be N. For example, all of $Y^1$ to $Y^4$ may be CH.

In some embodiments, one of $Y^5$ to $Y^8$ may be N, or none of $Y^5$ to $Y^8$ may be N. For example, all of $Y^5$ to $Y^8$ may be CH.

In some embodiments, Cz may be a structure represented by one of Formula 6 to Formula 13. In Formula 6 to Formula 13, any one of $R^{13}$ and $R^{14}$ may be bound to an adjacent atom.

Formula 6

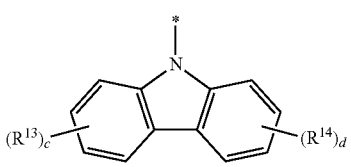

Formula 7

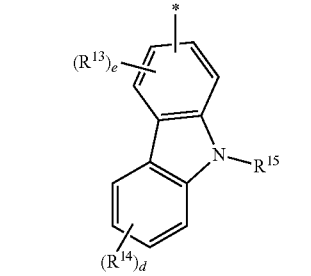

Formula 8

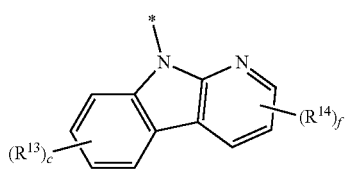

Formula 9

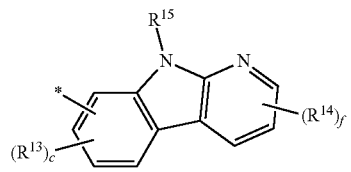

Formula 10

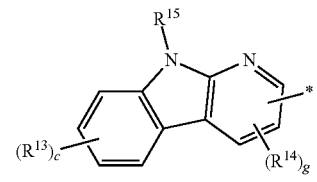

Formula 11

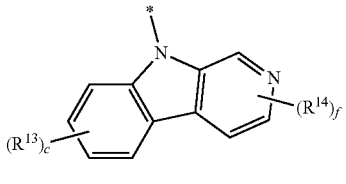

Formula 12

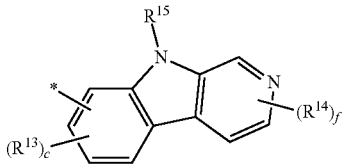

Formula 13

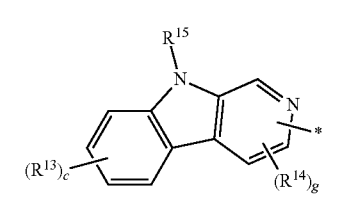

In Formula 6 to Formula 13, $R^{13}$ to $R^{15}$, c, and d may be the same as those defined in Formula 5,
e and f may each independently be an integer from 0 to 3,
g may be an integer from 0 to 2, and
* may be a binding site with an adjacent atom.

In some embodiments, $R^{13}$ to $R^{15}$ may each independently be a hydrogen, a substituted or unsubstituted C1-C20 alkyl group, a substituted or unsubstituted C1-C20 alkoxy group, a substituted or unsubstituted C6-C30 aryl group, or a substituted or unsubstituted C6-C30 amino aryl group. In some embodiments, $R^{13}$ to $R^{15}$ may each independently be a hydrogen, a substituted or unsubstituted C1-C20 alkyl group or a substituted or unsubstituted C6-C30 aryl group. In some other embodiments, $R^{13}$ to $R^{15}$ may each independently be a hydrogen, a C1-C15 linear alkyl group, a substituted or unsubstituted phenyl group, or a substituted or unsubstituted fluorenyl group.

In some embodiment, when at least two of $R^{13}$ to $R^{14}$ are adjacent to one another, the at least two of $R^{13}$ to $R^{14}$ may have a carbazole ring system or aza carbazole ring system represented by Formula 5, or may form a condensed ring by condensation with each other. The condensed ring may be, for example, an indolecarbazole ring.

In some embodiments, $R^{13}$ to $R^{15}$ may each independently be a C1-C15 linear alkyl group, for example, a C1-C12 linear alkyl group.

In some embodiments, in Formula 2, p may be an integer from 1 to 10, and in some other embodiments, an integer from 1 to 5. For example, p may be an integer of 1 or 2.

In some embodiments, the unit represented by Formula 2 may be selected from the structures represented by the following formulae. However, embodiments are not limited thereto.
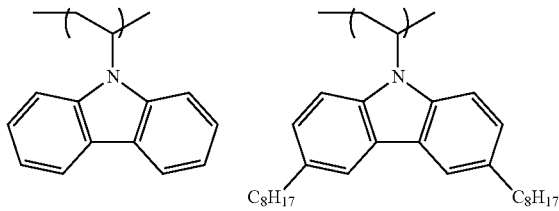
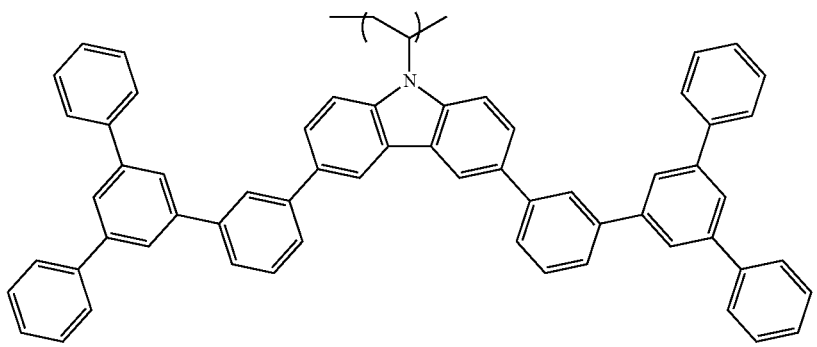
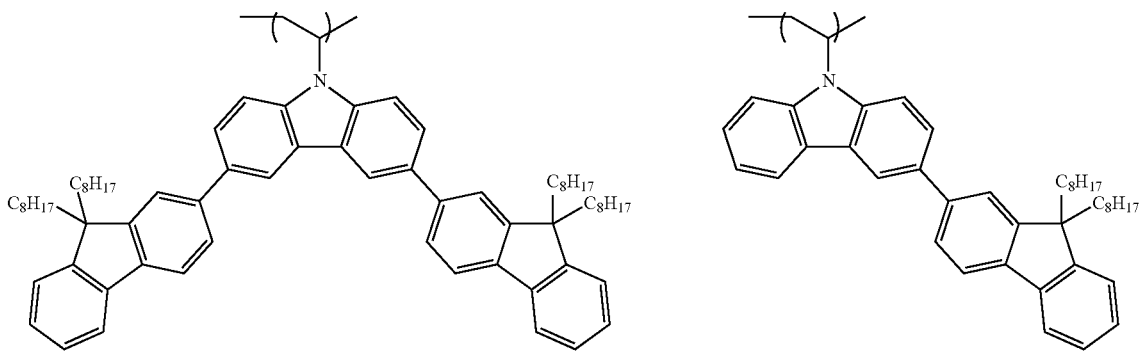
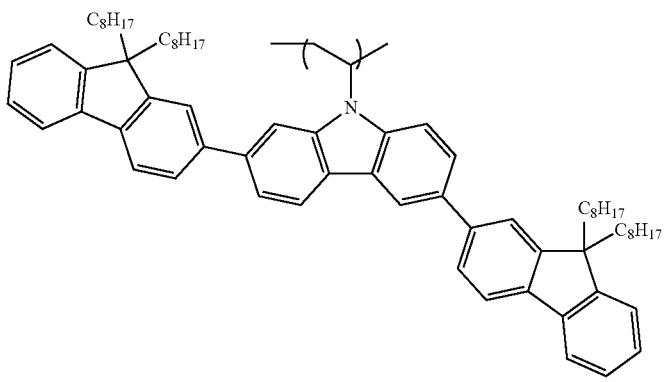

-continued
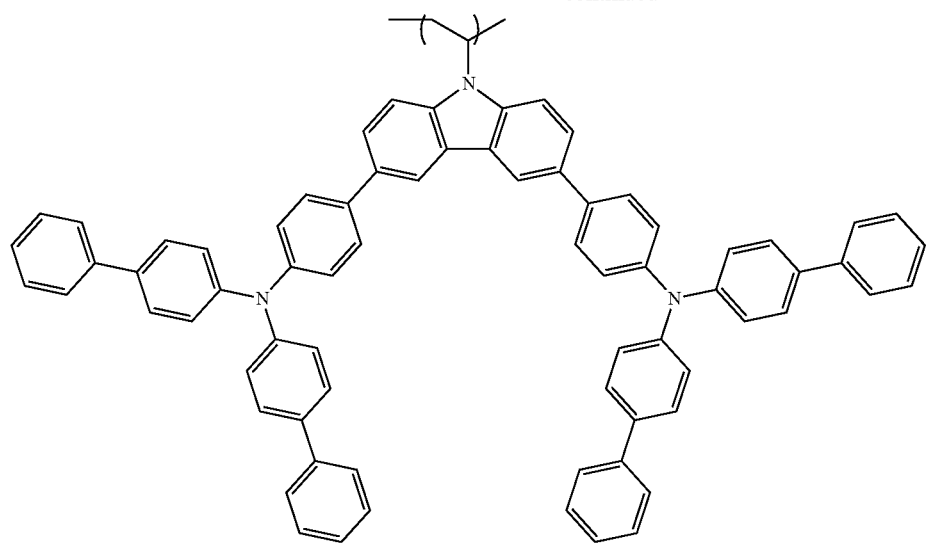
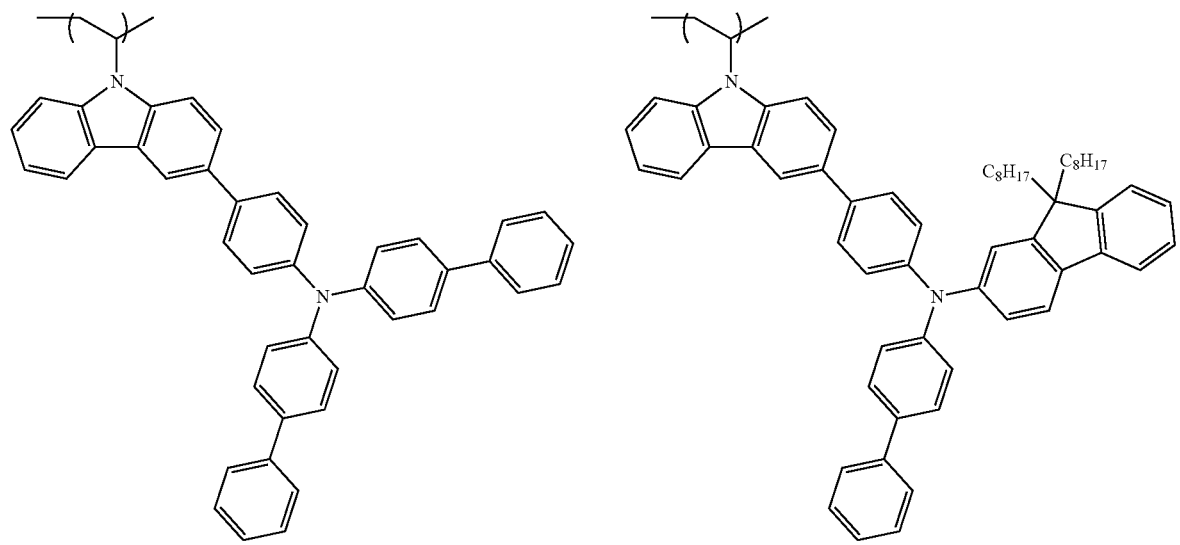
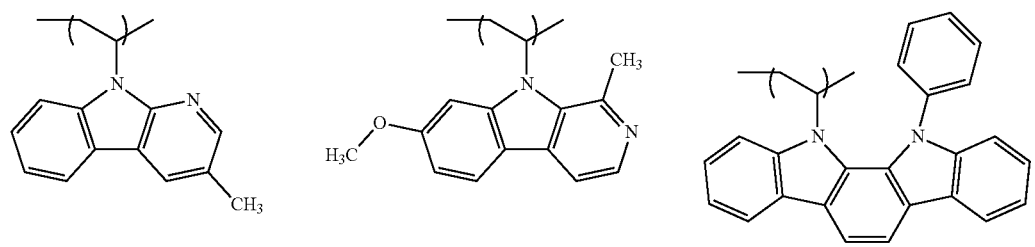

31
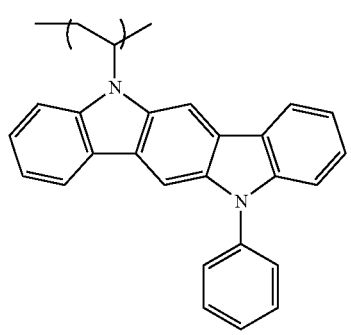 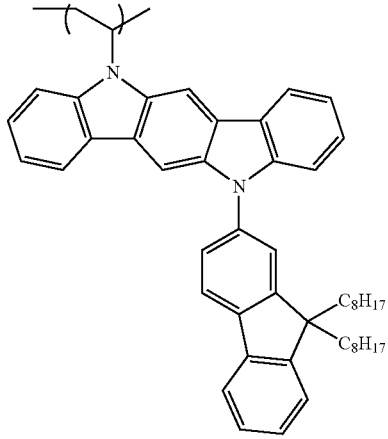
32
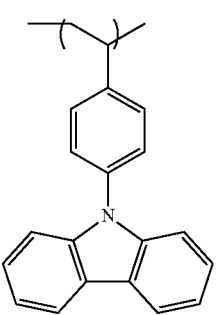
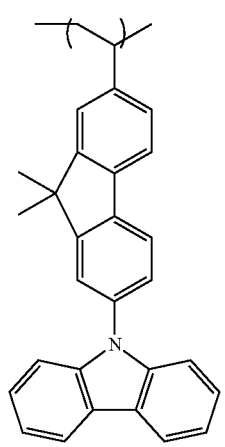 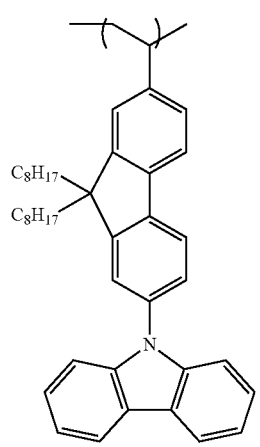 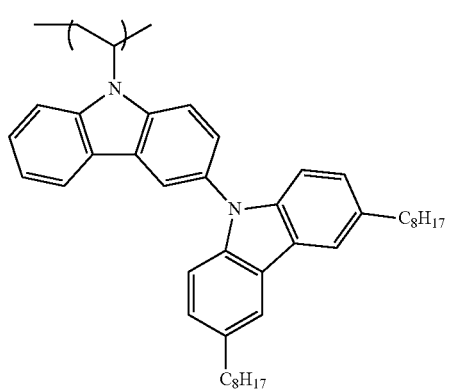
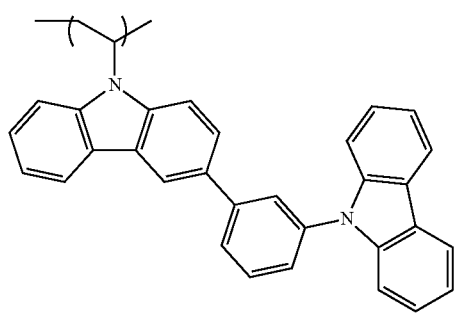 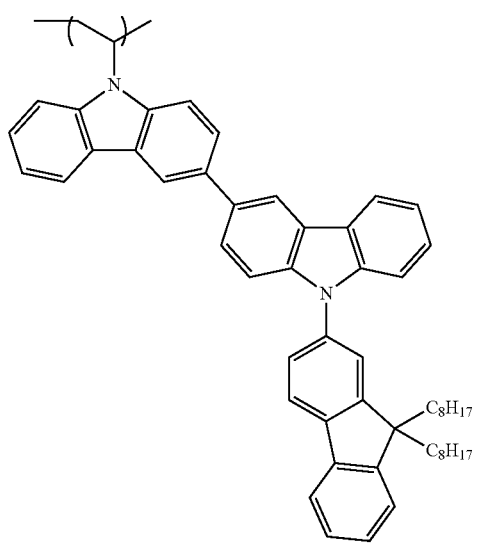

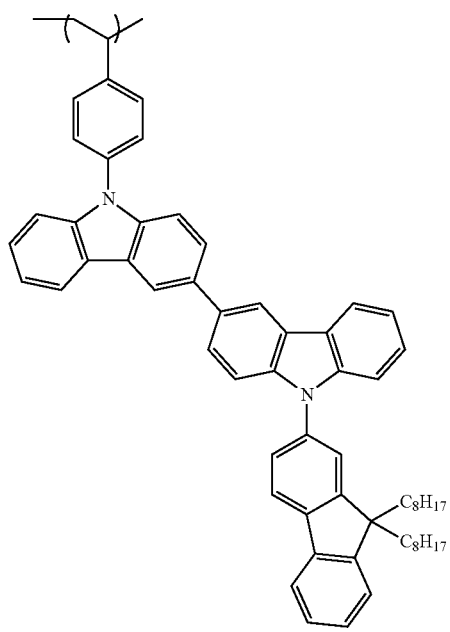
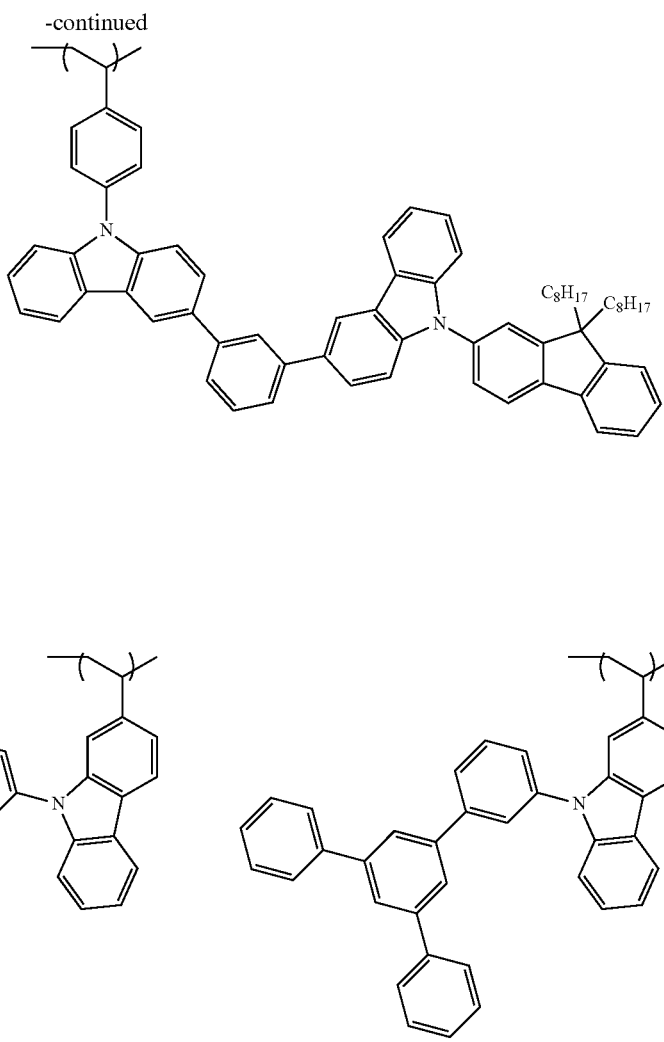

Other Units

In some embodiments, the copolymer may further include a unit, in addition to the above-described units. For example, the copolymer may further include a polymerizable unit, for example, a polymerizable comonomer including at least one group selected from the cross-linking groups represented by the following formulae. That is, the copolymer may further include a polymerizable comonomer, and the polymerizable comonomer may include at least one cross-linking group selected from the cross-linking groups represented by the following formulae.

Cross-Linking Groups

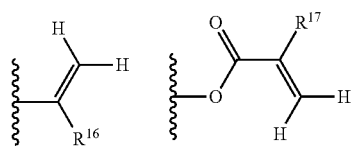

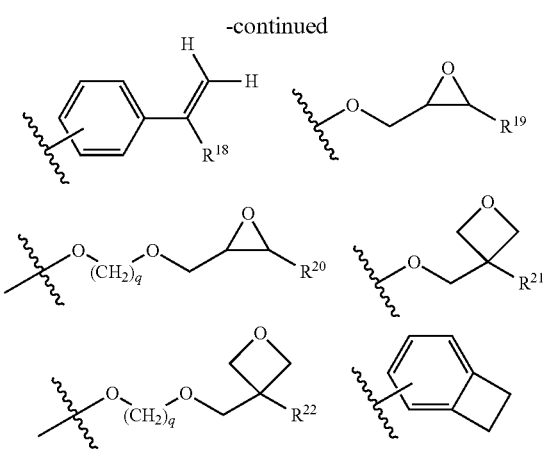

In the above formulae of the cross-linking groups, $R^{16}$ to $R^{22}$ may each independently be a hydrogen, or a substituted or unsubstituted C1-C10 alkyl group, and q may be an integer from 1 to 10.

In some embodiments, the polymerizable copolymer may originate from a compound represented by Formula 14.

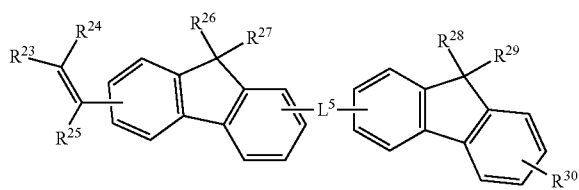

Formula 14

In Formula 14, $R^{23}$ to $R^{25}$ may each independently be a hydrogen, a substituted or unsubstituted C1-C10 alkyl group, or a substituted or unsubstituted C6-C30 aryl group, $R^{26}$ to $R^{30}$ may each independently be a hydrogen, a halogen atom, a hydroxyl group, an amino group, a nitro group, a cyano group, a substituted or unsubstituted silyl group, a substituted or unsubstituted C1-C10 alkyl group, a substituted or unsubstituted C3-C16 cycloalkyl group, a substituted or unsubstituted C6-C30 aryl group, a substituted or unsubstituted C1-C20 alkoxy group, a substituted or unsubstituted C6-C30 aryloxy group, a substituted or unsubstituted C7-C40 aralkyl group, a substituted or unsubstituted C1-C30 heteroaryl group, a substituted or unsubstituted C1-C20 alkylamino group, or a substituted or unsubstituted C6-C60 arylamino group; wherein any two adjacent groups selected from $R^{26}$ to $R^{30}$ may optionally form a ring, $L^5$ may be a single bond, a substituted or unsubstituted C1-C20 alkylene group, a substituted or unsubstituted C3-C16 cycloalkylene group, a substituted or unsubstituted C6-C30 arylene group, a substituted or unsubstituted C1-C20 oxyalkylene group, a substituted or unsubstituted C3-C16 oxycycloalkylene group, a substituted or unsubstituted C6-C30 oxyarylene group, a substituted or unsubstituted C7-C40 aralkylene group, a substituted or unsubstituted C1-C30 heteroarylene group, a substituted or unsubstituted C6-C30 amino arylene group, a silylene group substituted with an alkyl group or an aryl group, or a combination thereof, and at least one of $R^{26}$ to $R^{30}$ may be selected from the cross-linking groups represented above.

In some embodiments, $R^{16}$ to $R^{29}$ may be the same as $R^1$ to $R^4$ described above.

In some embodiments, a unit (repeating unit) corresponding to the polymerizable comonomer including at least one of the cross-linking groups may be selected from the structures represented by the following formulae. However, embodiments are not limited thereto.

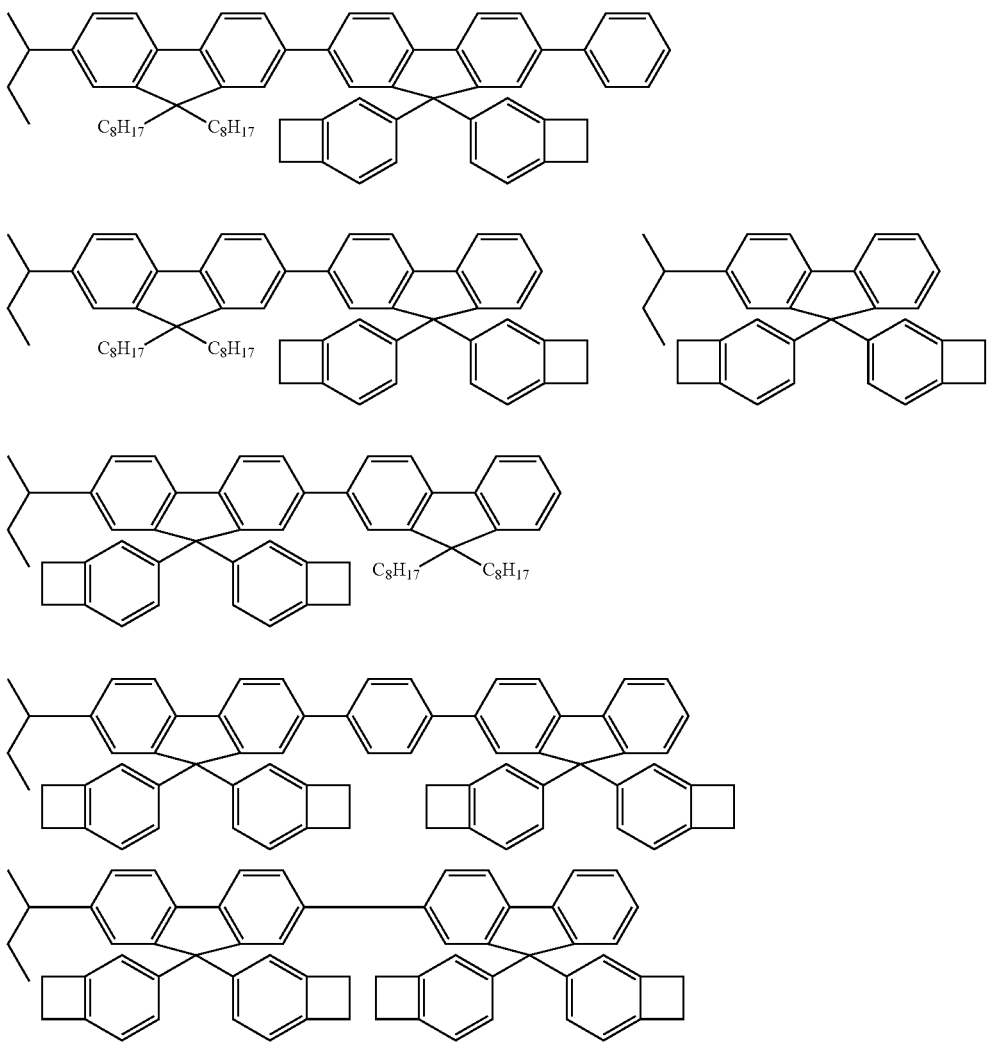

-continued
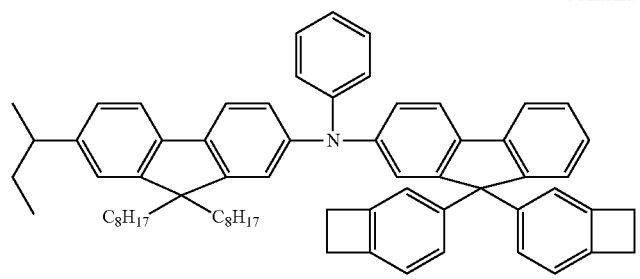
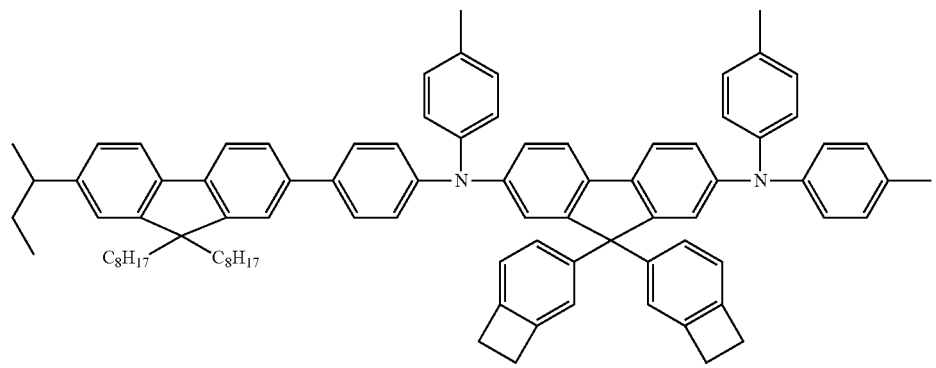
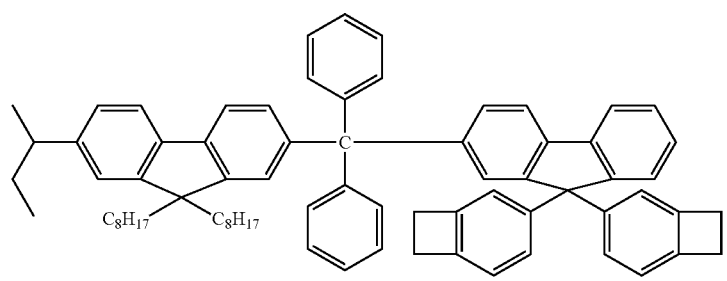
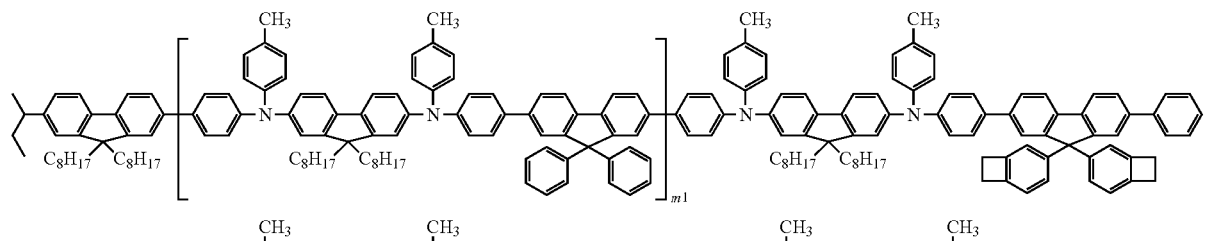
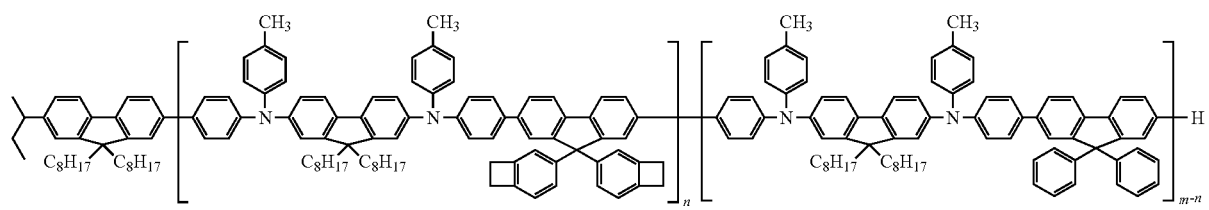
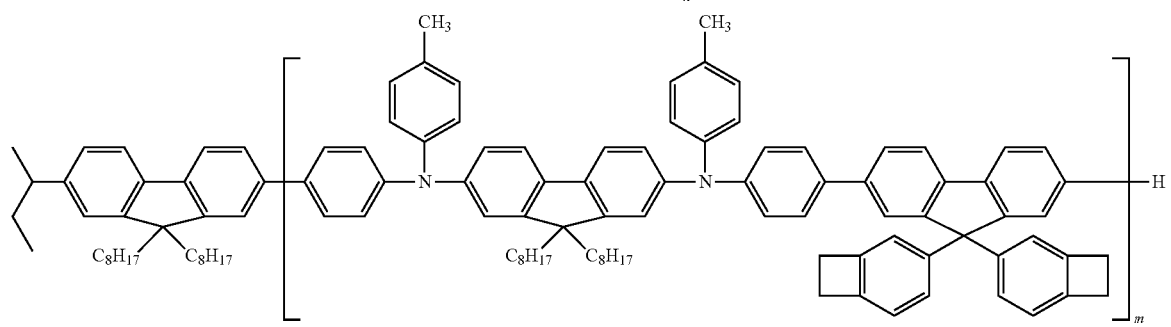

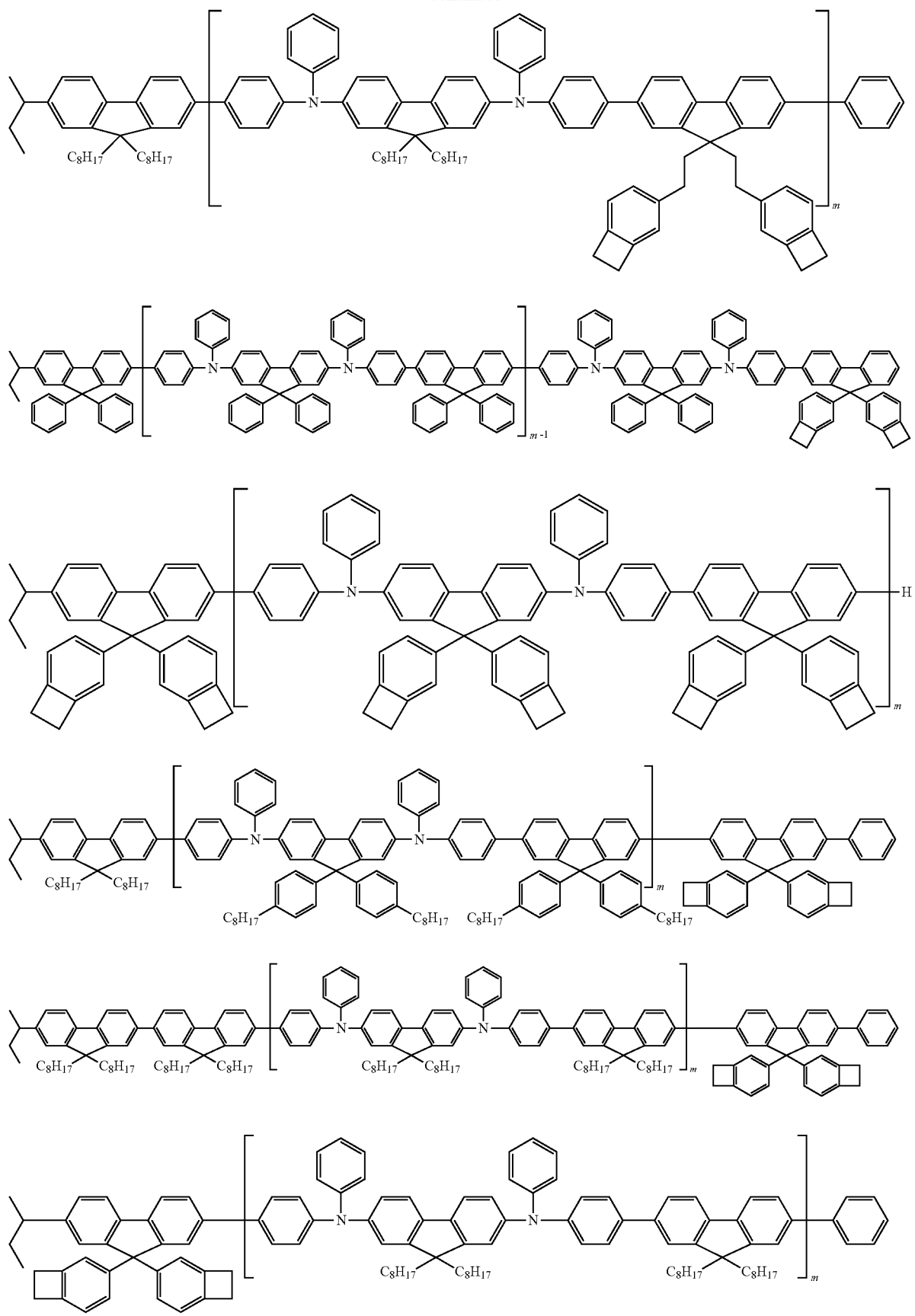

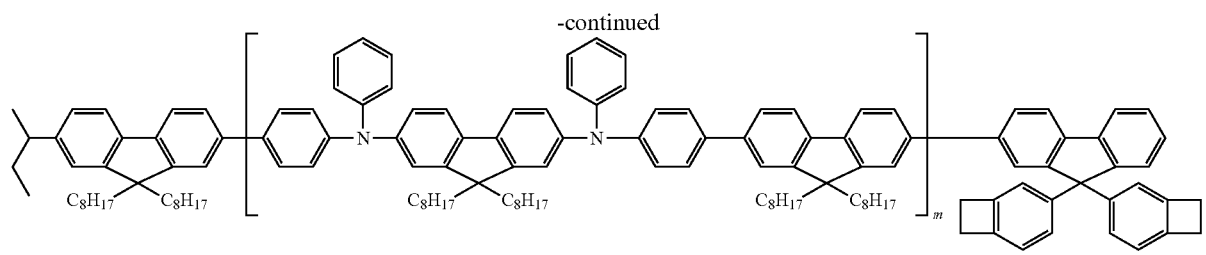
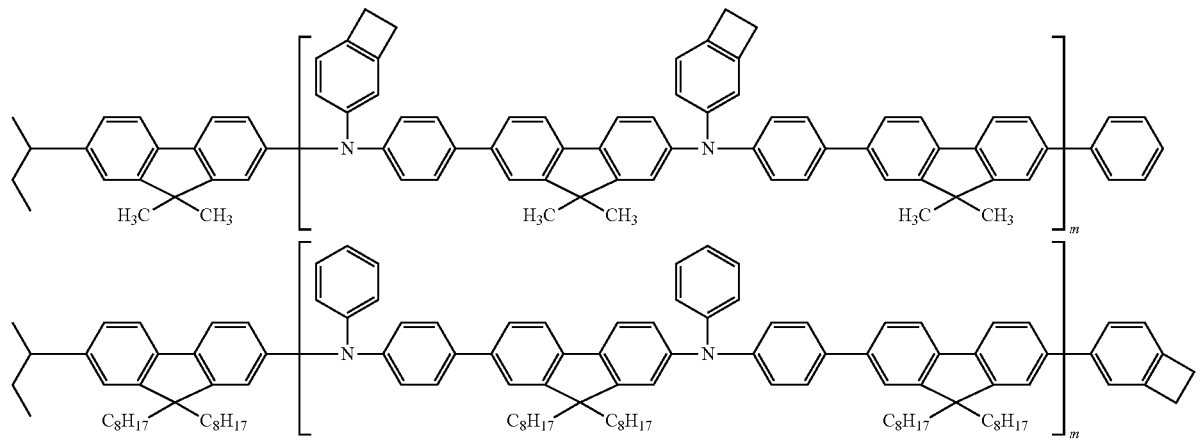
In the above formulae, m and n may each independently be, for example, an integer from 1 to 10.
In some embodiments, the copolymer may be selected from the structures represented by the following formulae.
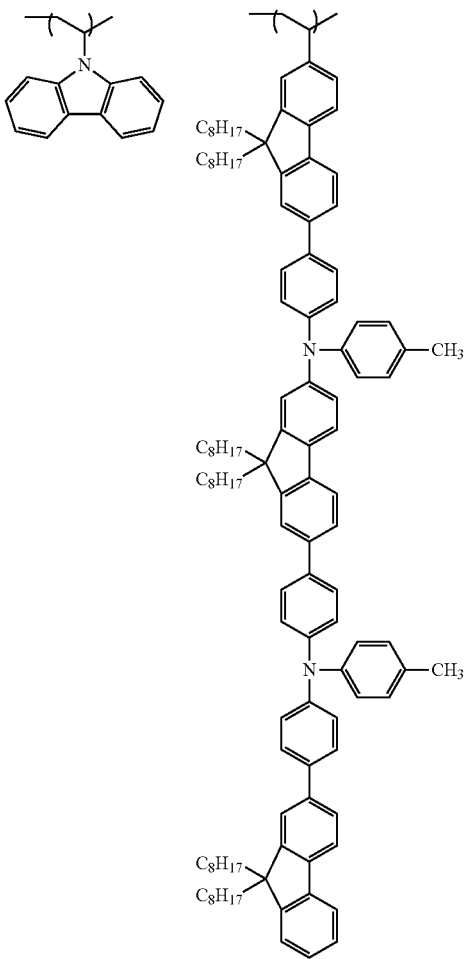

-continued

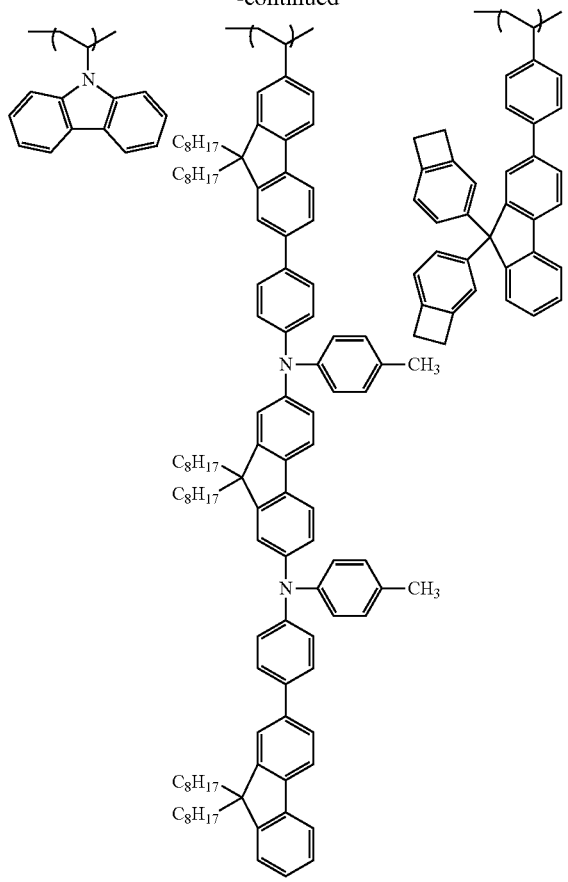

In some embodiments, the copolymer may be, for example, a random copolymer, an alternating copolymer, or a block copolymer. However, embodiments are not limited thereto.

In some embodiments, the copolymer may have a number average molecular weight of about 10,000 to 100,000 Daltons, for example, about 30,000 to 100,000 Daltons, or about 50,000 to 100,000 Daltons. However, embodiments are not limited thereto.

An organic light-emitting device including a copolymer according to any of the above-described embodiments may have improved lifespan. As the copolymer according to any of the above-described embodiments includes a polymerizable comonomer including such a cross-linking group as represented above, a coating layer including the copolymer may have improved stability, and the organic light-emitting device including the coating layer may have improved emission characteristics and stability.

A copolymer according to any of the above-described embodiments may be synthesized by a known synthesis method, for example, by a radical polymerization method. Detailed methods of preparing a copolymer according to any of the above-described embodiments will be understood based on the following examples.

Organic Light-Emitting Device Material

According to an aspect of the present disclosure, there is provided an organic light-emitting device material including a copolymer according to any of the above-described embodiments. The copolymer may have application as an organic light-emitting device material. The copolymer may have hole transport and hole injection abilities. Thus, the organic light-emitting device material according to an embodiment may be used as, for example, a material of a hole transport layer, a hole injection layer, or an emission layer.

In some embodiments, the organic light-emitting device material may be a material of the emission layer, and the copolymer according to any of the above-described embodiment may be used as a host material. In this case, the organic light-emitting device material may further include a compound with hole transport ability.

The compound with hole transport ability is not specifically limited, and may be, for example, a hole injection material, a hole transport material, or a host material which are known in the art, which will be described below.

In some embodiments, the organic light-emitting device material may be a material of the emission layer, and may further include a light-emitting material, which may be selected from light-emitting materials which will be described below.

An organic light-emitting device material according to an embodiment may include a copolymer according to any of the above-described embodiments, and a solvent. In some embodiments, the organic light-emitting device material may be used, for example, to form a layer of an organic light-emitting device by using a solution coating method.

The solvent is not specifically limited, and may be, for example, a solvent capable of dissolving the organic light-emitting device material.

In some embodiments, the solvent may be, for example, an aromatic solvent, such as toluene, xylene, ethylbenzene, diethylbenzene, mesitylene, propylbenzene, cyclohexylbenzene, dimethoxybenzene, anisole, ethoxy toluene, phenoxy toluene, isopropylbiphenyl, dimethylanisole, phenyl acetate, phenyl propionate, methyl benzoate, and ethyl benzoate. However, embodiments are not limited thereto.

Organic Light-Emitting Device

An organic light-emitting device according to an embodiment will be described in detail with reference to FIG. 1.

Referring to FIG. 1, an organic light-emitting device 100 according to an embodiment may include a substrate 110, a first electrode 120 on the substrate 110, a hole injection layer 130 on the first electrode 120, a hole transport layer 140 on the hole injection layer 130, an emission layer 150 on the hole transport layer 140, an electron transport layer 160 on the emission layer 150, an electron injection layer 170 on the electron transport layer 160, and a second electrode 180 on the electron injection layer 170, i.e., which are sequentially in the stated order. However, the organic light-emitting device 100 may have a structure not limited thereto.

The substrate 110 may be any substrate used in general organic light-emitting devices. For example, the substrate 110 may be a glass substrate, a silicon substrate, or a transparent plastic substrate.

The first electrode 120 may be formed on the substrate 110. The first electrode 12 may be, for example, an anode. The first electrode 12 may be formed of a metal, an alloy, or a conductive compound that have high work function. For example, first electrode 120 may be formed of a material having good transparency and good conductivity, for example, indium tin oxide (ITO), indium zinc oxide (IZO), tin oxide ($SnO_2$), or zinc oxide (ZnO). The first electrode 120 may be formed as a reflective electrode from, for example, magnesium (Mg) or aluminum (Al).

The hole injection layer 130 may be formed on the first electrode 120. The hole injection layer 130 may facilitate injection of holes from the first electrode 120. The hole injection layer 130 may have a thickness of about 10 nanometers (nm) to about 1,000 nm, in some embodiments, about 10 nm to about 500 nm, and in some other embodiments, about 10 nm to about 100 nm.

The hole injection layer 130 may be formed of a known hole injection material, for example, triphenylamine-containing poly(ether ketone) (TPAPEK), 4-isopropyl-4'-methyldiphenyl iodonium tetrakis (pentafluorophenyl) borate (PPBI), N,N'-diphenyl-N,N'-diphenyl-N,N'-bis-[4-(phenyl-m-tolyl-amino)-phenyl]-biphenyl-4,4'-diamine (DNTPD), copper phthalocyanine, 4,4',4"-tris(N-3-methylphenyl-N-phenyl amino)triphenylamine (m-MTDATA), N,N'-di(1-naphthyl)-N,N'-diphenylamine (NPB), 4,4',4"-tris(N,N'-2-naphthylphenylamino) triphenylamine (2-TNATA), polyaniline/dodecylbenzene sulfonic acid, poly(3,4-ethylenedioxythiophene)/poly(4-styrene sulfonate), or polyaniline/10-camphor sulfonic acid.

The hole transport layer 140 may be formed on the hole injection layer 130. The hole transport layer 140 may include a hole transporting material with the ability to form holes. The hole transport layer 140 may have a thickness of about 10 nm to about 150 nm, for example, about 10 nm to about 100 nm. The hole transport layer 140 may be formed using a copolymer according to any of the above-described embodiments by a solution coating method. This method using the copolymer may improve the emission lifespan of the organic light-emitting device 100 and may facilitate formation of a large-area film.

The emission layer 150 may be formed on the hole transport layer 140. The emission layer 150 may be a fluorescent or phosphorescent emission layer. The emission layer 150 may be formed by a vacuum deposition method, a spin coating method, or an ink jet method. The emission layer 150 may have a thickness of, for example, about 10 nm to about 60 nm, or for example, about 10 nm to about 40 nm.

The emission layer 150 may include a known light-emitting material. For example, the emission layer 150 may include a light-emission material that may emit light (phosphorescence) from triplet excitons. This may further improve the emission lifespan of the organic light-emitting device 100.

The emission layer 150 may include a host material, for example, tris(8-quinolinolinato) aluminum ($Alq_3$), 4,4'-N, N'-dicabazole-biphenyl (CBP), poly(n-vinylcabazole) (PVK), 9,10-di(naphthalen-2-yl)anthracene) (ADN), 4,4', 4"-tris(N-carbazole)triphenylene (TCTA), 1,3,5-tris(N-phenyl-benzimidazole-2-yl)benzene (TPBI), 3-tert-butyl-9,10-di(naphth-2-yl)anthracene (TBADN), distyrylarylene (DSA), or 4,4'-bis(9-carbazol)-2,2'-dimethylbiphenyl (dm-CBP).

The emission layer 150 may include a dopant material. Examples of the dopant material may include perylene and a derivative thereof, rubrene and a derivative thereof, coumarin and a derivative thereof, 4-(dicyanomethylene)-2-methyl-64[p-(dimethylamino)styryl]-4H-pyran) (DCM) and a derivative thereof, an iridium (Ir) complex such as bis[2-(4,6-difluorophenyl) pyridinate]picolinate iridium (III) (Fl-rpic), bis(1-phenylisoquinoline)(acetylacetonato)iridium (III) [$Ir(piq)_2(acac)$], and tris(2-phenylpyridine) iridium(III) [$Ir(ppy)_3$], an osmium (Os) complex, and a platinum (Pt) complex.

The electron transport layer 160 may be formed on the emission layer 150. The electron transport layer 160 may be a layer capable of transporting electrons. The electron transport layer 160 may be formed by, for example, a vacuum deposition method, a spin coating method, or an inkjet method. For example, the electron transport layer 160 may have a thickness of about 15 nm to about 50 nm, for example, about 20 nm to about 35 nm.

The electron transport layer 160 may be formed of a known electron transport material. Examples of the known electron transport material are tris(8-quinolinolinato) aluminum ($Alq_3$) and a compound having a nitrogen-containing aromatic ring. Examples of the nitrogen-containing aromatic ring are a pyridine ring-containing compound such as (1,3, 5-tri[(3-pyridyl)-phenyl-3-yl]benzene), a triazine ring-containing compound such as 2,4,6-tris(3'-(pyridine-3-yl)biphenyl-3-yl)-1,3,5-triazine, and an imidazole ring-containing compound such as 2-(4-(N-phenylbenzoimidazolyl-1-yl-phenyl)-9,10-dinaphthylanthracene). In some embodiments, the electron transport layer 160 may use a commercially available electron transport material, for example, KLET-01, KLET-02, KLET-03, KLET-10, or KLET-M1 (available from Chemipro Kasei).

The electron injection layer 170 may be formed on the electron transport layer 160. The electron injection layer 170 may facilitate injection of electrons from the second electrode 180. The electron injection layer 170 may be formed on the electron transport layer 160 by, for example, a vacuum deposition method. For example, the electron injection layer 170 may have a thickness of about 0.3 nm to about 9 nm, for example, about 1 nm to about 5 nm.

The electron injection layer 170 may be formed of a known electron injection material, for example, (8-quinolinato)lithium (Liq), lithium fluoride (LiF), sodium chloride (NaCl), cesium fluoride (CsF), lithium oxide ($Li_2O$), barium oxide (BaO), or the like.

The second electrode 180 may be formed on the electron injection layer 170. The second electrode 180 may be, for example, a cathode. The second electrode 180 may be formed of a metal, an alloy, or a conductive compound that have a low work function. For example, the second electrode 180 may be formed of lithium (Li), magnesium (Mg), aluminum (Al), calcium (Ca), an aluminum-lithium (Al—Li) alloy, a magnesium-indium (Mg—In) alloy, a magnesium-silver (Mg—Ag) alloy, or the like. In some embodiments, the second electrode 180 may be formed as a transmissive electrode, for example, from indium tin oxide (ITO), indium zinc oxide (IZO), or the like.

Example embodiments of the structure of the organic light-emitting device 100 have been described above. The organic light-emitting device 100 according to an embodiment may have improved emission lifespan due to the inclusion of a copolymer according to any of the above-described embodiments.

Example embodiments of the structure of the organic light-emitting device 100 are described above. However, embodiments are not limited to the above-described structures of the organic light-emitting device 100. The organic light-emitting device 100 as an embodiment of the present disclosure may have any of known various structures. For example, the organic light-emitting device 100 may have a structure without at least one of the hole injection layer 130, the hole transport layer 140, the electron transport layer 160, and the electron injection layer 170. Each of these layers of the organic light-emitting device 100 may be formed as a single layer or multiple layers.

For example, the organic light-emitting device 100 may further include a hole blocking layer between the hole transport layer 140 and the emission layer 150 to prevent diffusion of triplet excitons or holes into the electron transport layer 160. For example, the hole blocking layer may be formed of an oxadiazole derivative, a triazole derivative, a phenanthroline derivative, or the like.

One or more embodiments of copolymers, organic light-emitting device materials, organic light-emitting device preparation compositions, and organic light-eitting devices according to the present disclosure will now be described in detail with reference to the following examples. However, these examples are only for illustrative purposes and are not intended to limit the scope of the one or more embodiments of the present disclosure.

EXAMPLES

Synthesis of Monomer

A monomer A was synthesized according to the following processes.

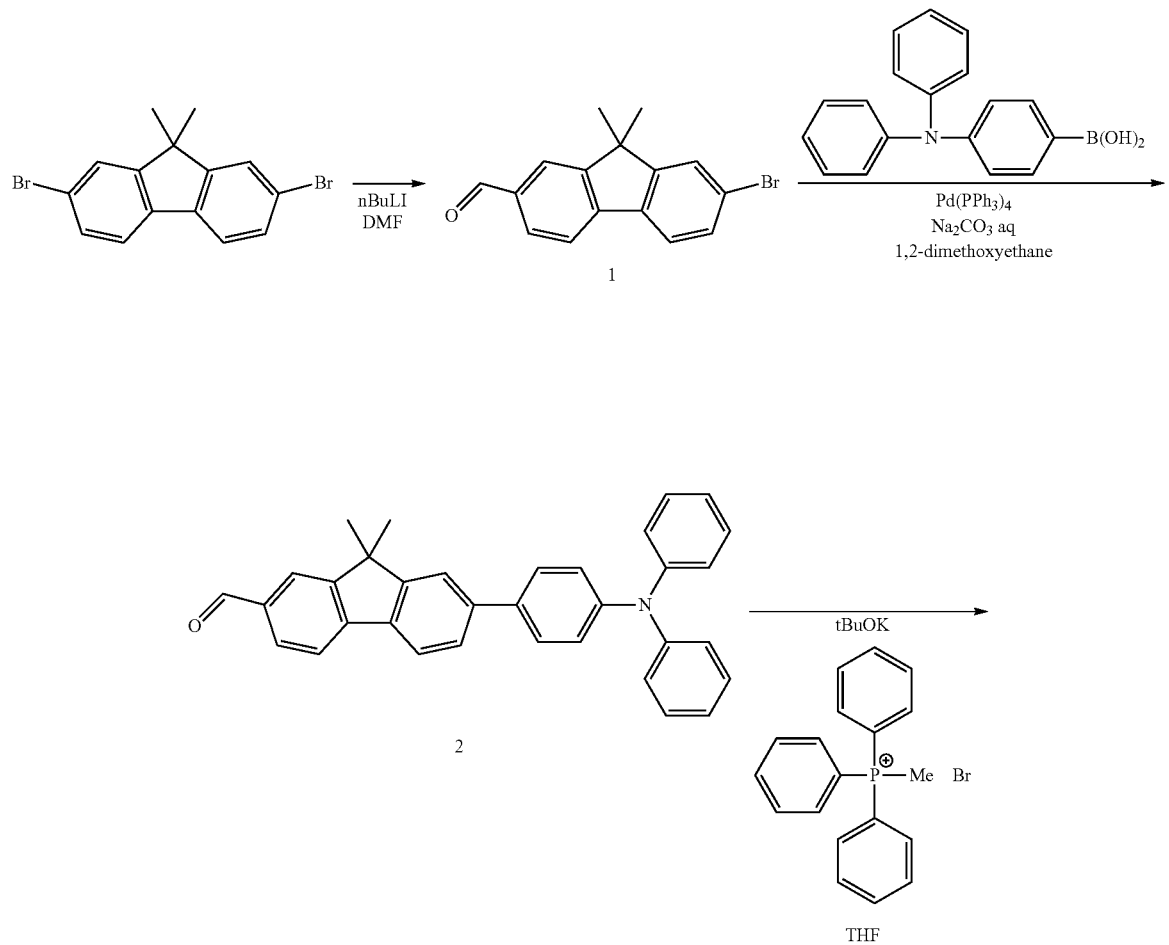

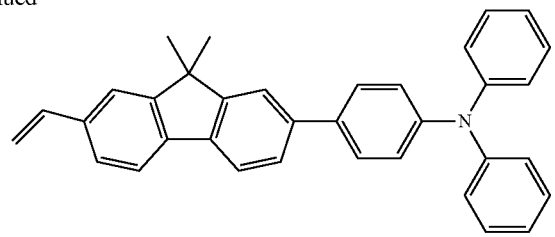

Monomer A 4.83 grams (g) (13.9 millimoles, mmol) of 2,7-dibromo-9,9-dimethyl-9H-fluorene was added to a 300-mL three-neck flask, followed by purging the flask with argon. 50 mL of anhydrous tetrahydrofuran (THF) was added to the flask, which was then cooled down with dry ice/acetone. After 5.6 mL of a 2.6 molar (M) n-butyllithium in hexane solvent was dropwise added thereto, the resulting mixture was maintained for about 1 hour and cooled down with a refrigerant, followed by dropwise addition of 1.7 mL of an anhydrous N,N-dimethylformamide (DMF) and stirring for about 1 hour. After the temperature increased to room temperature, impurities were separated from the resulting mixture with a Celite. Next, distilled water was added to the resulting solution, followed by extraction with toluene to collect an organic phase. This organic phase was concentrated to obtain a concentrate solution, and the concentrate solution was purified by column chromatography to obtain a compound 1.

4.16 g (13.8 mmol) of the compound 1, 4.63 g (15.2 mmol) of diphenylaminophenylboronic acid, 0.48 g (0.41 mmol) of tetrakis(triphenylphosphine)palladium, 30 mL of 1,2-dimethoxyethane, and 16.5 mL of a 2 M aqueous sodium carbonate solution were added to a reactor under argon atmosphere, and the resulting mixture was stirred at about 80° C. for about 7 hours. After cooling down to room temperature, the resulting product was extracted three times with toluene/water to collect an organic phase. This organic phase was concentrated and then purified by column chromatography to obtain a compound 2.

4.07 g (11.4 mmol) of triphenylmethyl phosphonium bromide and 30 mL of anhydrous THF were added to a reactor under argon atmosphere, and then, cooled down with ice. Next, a solution of 1.29 g (11.5 mmol) of potassium t-butoxide (tBuOK) dissolved in 30 mL of anhydrous THF was dropwise added to the reactor, and then, a solution of 5.28 g (11.0 mmol) of the compound 2 dissolved in 30 mL of anhydrous THF was dropwise added thereto. After the temperature returned to room temperature, the resulting mixture was stirred at room temperature for about 3 hours. After the reaction was quenched, the resulting product was extracted three times with toluene/water, followed by purification by column chromatography, to obtain monomer A. A structure of the monomer A was identified by (high-performance) liquid chromatography-mass spectrometry (LC-MS).

Synthesis of Copolymer

Next, a polymer A was synthesized from the monomer A and vinylcabazole by the following method.

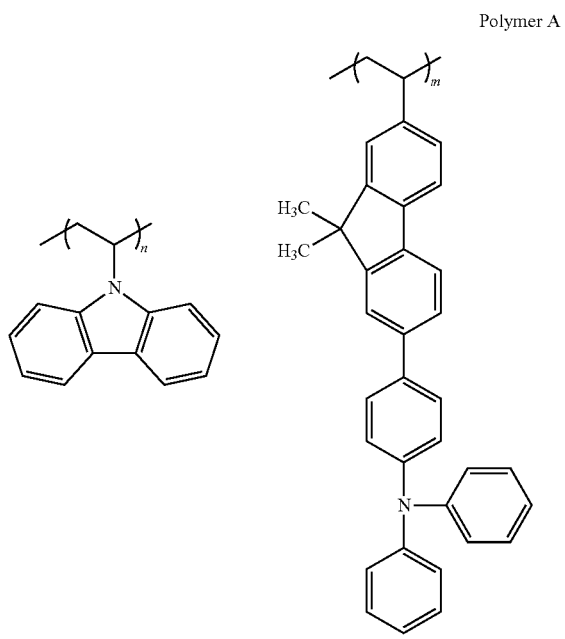

Polymer A 0.50 g (1.04 mmol) of the monomer A, 0.50 g (2.59 mmol) of vinylcabazole, 0.005 g (0.0305 mmol) of azobisisobutyronitrile (AIBN), and 10 mL of anhydrous toluene were added to a reactor under argon atmosphere and then stirred at about 80° C. for about 8 hours. After cooling the resulting mixture to room temperature, methanol was added thereto to obtain a precipitate. The resulting precipitate (solid) was dissolved in THF and purified by reprecipitation with acetone, to thereby obtain 0.24 g of the polymer A including units represented in the above formula. The polymer A had a number average molecular weight (Mn) of about 29,100 Daltons and a weight average molecular weight (Mw) of about 79,100 Daltons, as measured by gel permeation chromatography (GPC). The ratio of n to m in the polymer A was about 7:3.

Glass Transition Temperature Measurement

The glass transition temperature (Tg) of the polymer A was measured using a SII DSC 6220 (available from Seiko Instruments Inc.), according to the JIS K 7121.

Layer Stability Evaluation

The stability of a layer formed using the polymer A was evaluated according to the following processes. A solution of 1 percent by mass (mass %) of the polymer A in xylene was spin-coated on an indium tin oxide (ITO) layer having a thickness of about 150 nm formed on a glass substrate, to form a coating layer having a thickness of about 30 nm.

A surface of the formed coating layer was observed using an optical microscope to evaluate a surface state of the coating layer according to the following criteria.

○: The surface of the layer was uniform and no defect was observed.

Δ: A few dark spots were detected on the layer, but the layer was applicable to a device ×: Continuity of the layer not ensured, and the layer was not applicable to a device.

Example 1

Manufacture of Organic Light-Emitting Device

An organic light-emitting device including the above-described copolymer was manufactured according to the following processes.

First, a hole injection layer was formed by spin-coating PEDOT/PSS (available from Sigma-Aldrich) on a glass substrate having an indium tin oxide (ITO) first electrode (anode) in a stripe pattern to have a thickness of about 30 nm after drying.

Next, 1 mass % of the synthesized polymer A was dissolved in xylene to prepare a hole transport layer coating solution. The hole transport layer coating solution was coated on the hole injection layer to have a thickness of about 30 nm after being dried, and then heated at about 230° C. for about 1 hour to form a hole transport layer.

Next, triphenylenyl 3,6-bis-N-carbazolylbenzene (TPSmCP) and 4,4'-bis(carbazole-9-yl)biphenyl (CBP) as host materials, and tris(2-(3-xylyl)phenylpyridine iridium (III) (TEG) as a dopant material were co-deposited on the hole transport layer using a vacuum deposition apparatus to form an emission layer having a thickness of about 30 nm. The ratio of TPSmCP to CBP was about 7:3 by mass, and a doped amount of tris(2-3-xylyl)phenylpyridine iridium (III) was about 10 mass %.

Next, (8-quinolinolato) lithium (Liq) and KLET-03 (available from Chemipro Kasei) were co-deposited on the emission layer using the vacuum deposition apparatus to form an electron transport layer having a thickness of about 50 nm. Lithium fluoride (LiF) was then deposited on the electron transport layer using the vacuum deposition apparatus to form an electron injection layer having a thickness of about 1 nm. Aluminum was then deposited on the electron injection layer using the vacuum deposition apparatus to form a second electrode (cathode) having a thickness of about 100 nm, thereby finally manufacturing the organic light-emitting device.

Evaluation of Organic Light-Emitting Device

The current efficiency and emission lifespan of each organic light-emitting device were evaluated according to the following methods.

A predetermined voltage was applied to each organic light-emitting device using a direct current constant-voltage power source (Source meter, available from KEYENCE) to operate the organic light-emitting device. While the emission of the organic light-emitting device was measured using a luminance measurement apparatus (SR-3, available from Topcom), the current was gradually increased to measure a current density at a luminance of about 3000 candelas per square meter (cd/m$^2$), and then maintained constant. A current efficiency was calculated from the current density.

The emission lifespan of each organic light-emitting device was defined as the time took until an initial luminance measured using the luminance measurement apparatus was reduced by about 80%.

The evaluation results are shown in Table 1. In Table 1, the current efficiencies, and the emission lifespans as relative values to the emission lifespan of Comparative Example 1 assumed as 100 are represented.

Examples 2 and 3 and Comparative Examples 1 and 2

Organic light-emitting devices were manufactured in the same manner as in Example 1, except that hole transport layers were formed using different polymers, respectively, instead of the polymer used in Example 1. The results of evaluation of the organic light-emitting devices are shown in Table 1.

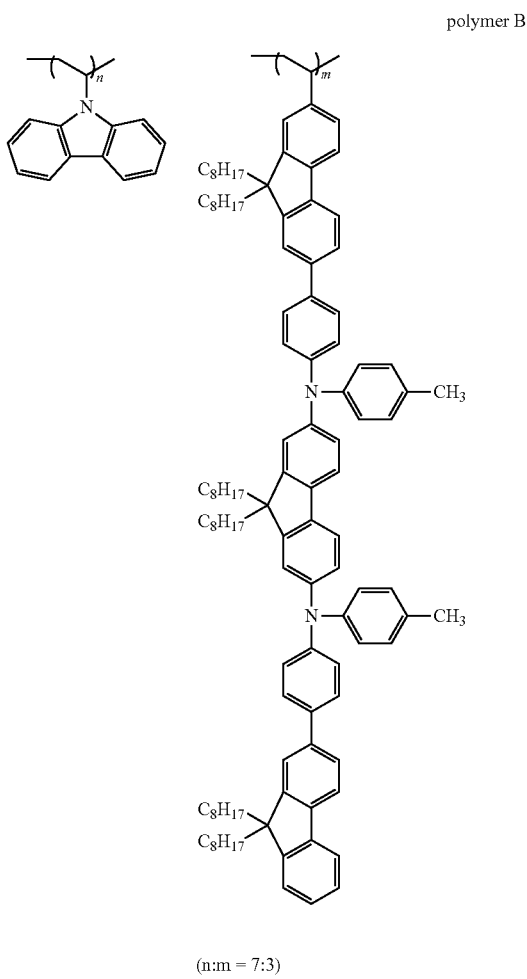

polymer B (n:m = 7:3)

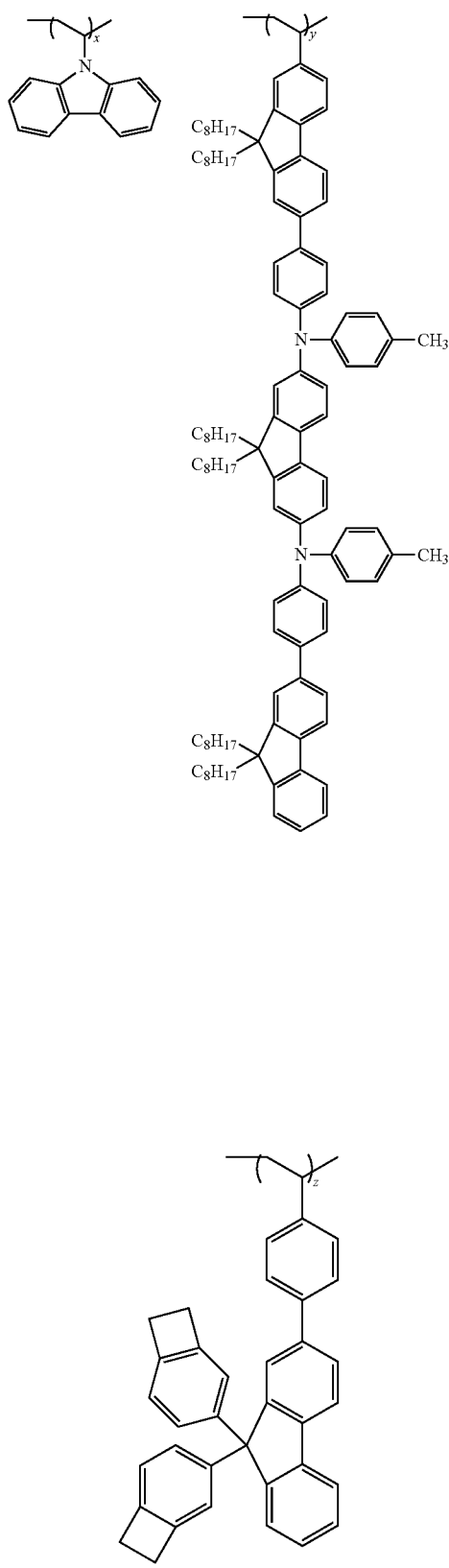
(x:y:z = 65:25:10)
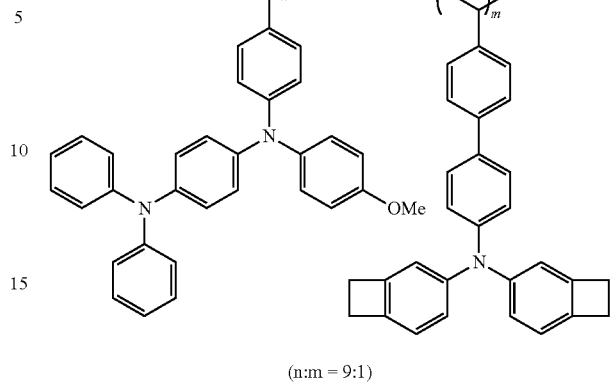
(n:m = 9:1)
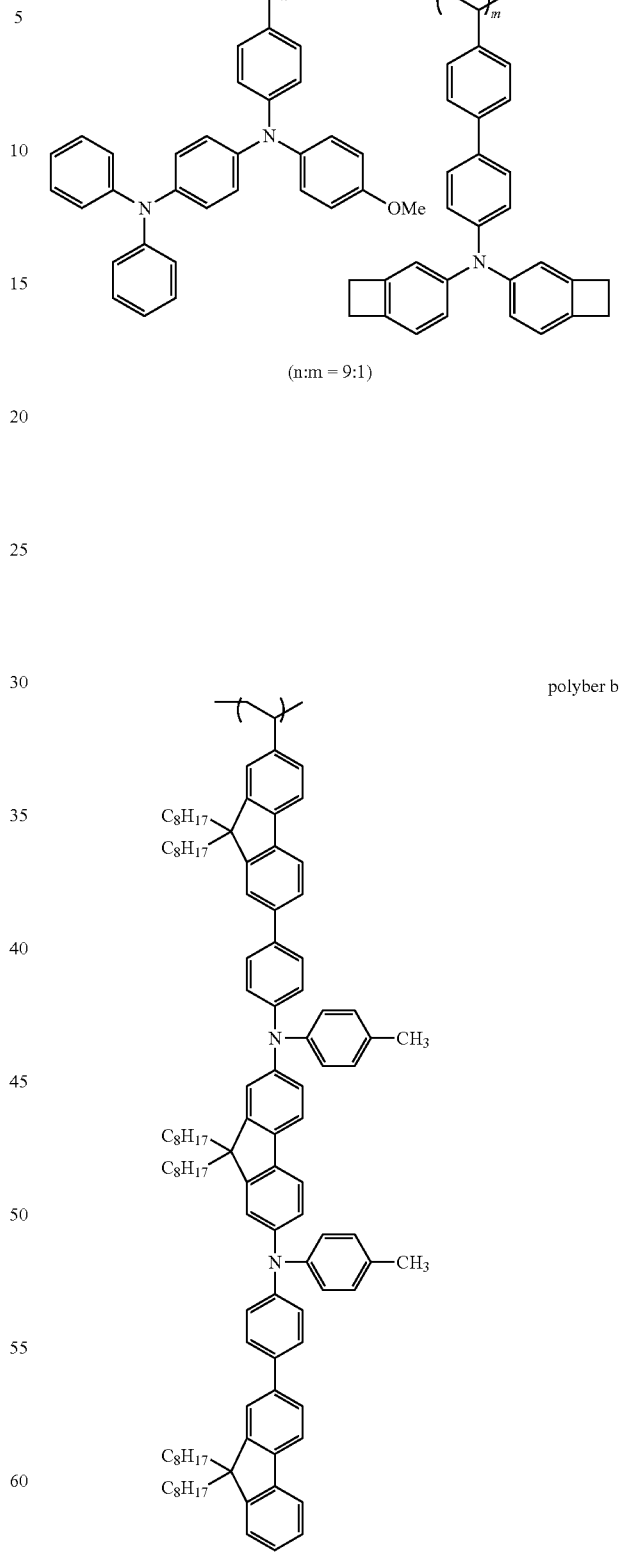
Monomers used in the synthesis of polymers B, C and b were synthesized according to the following reaction schemes.

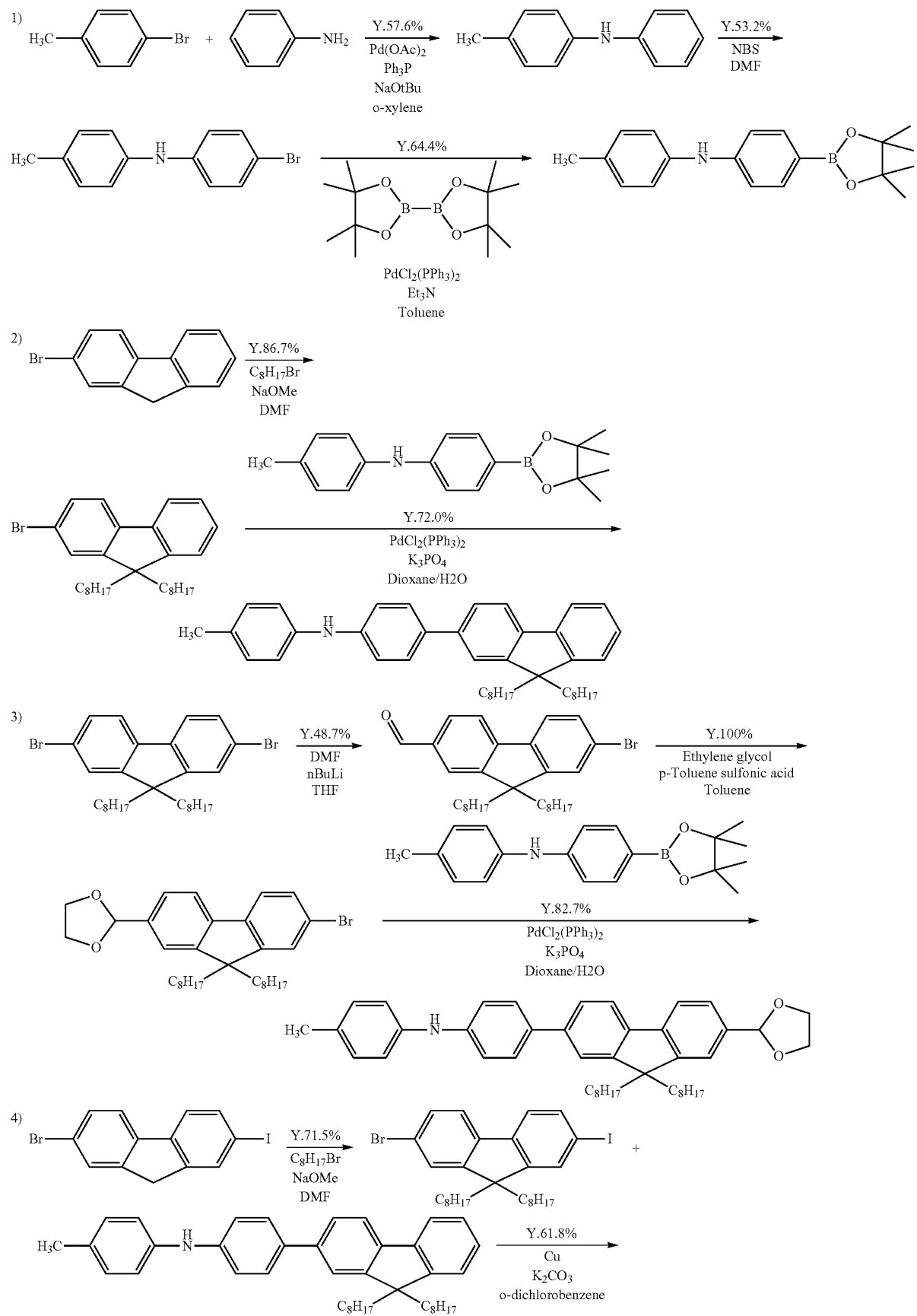

-continued
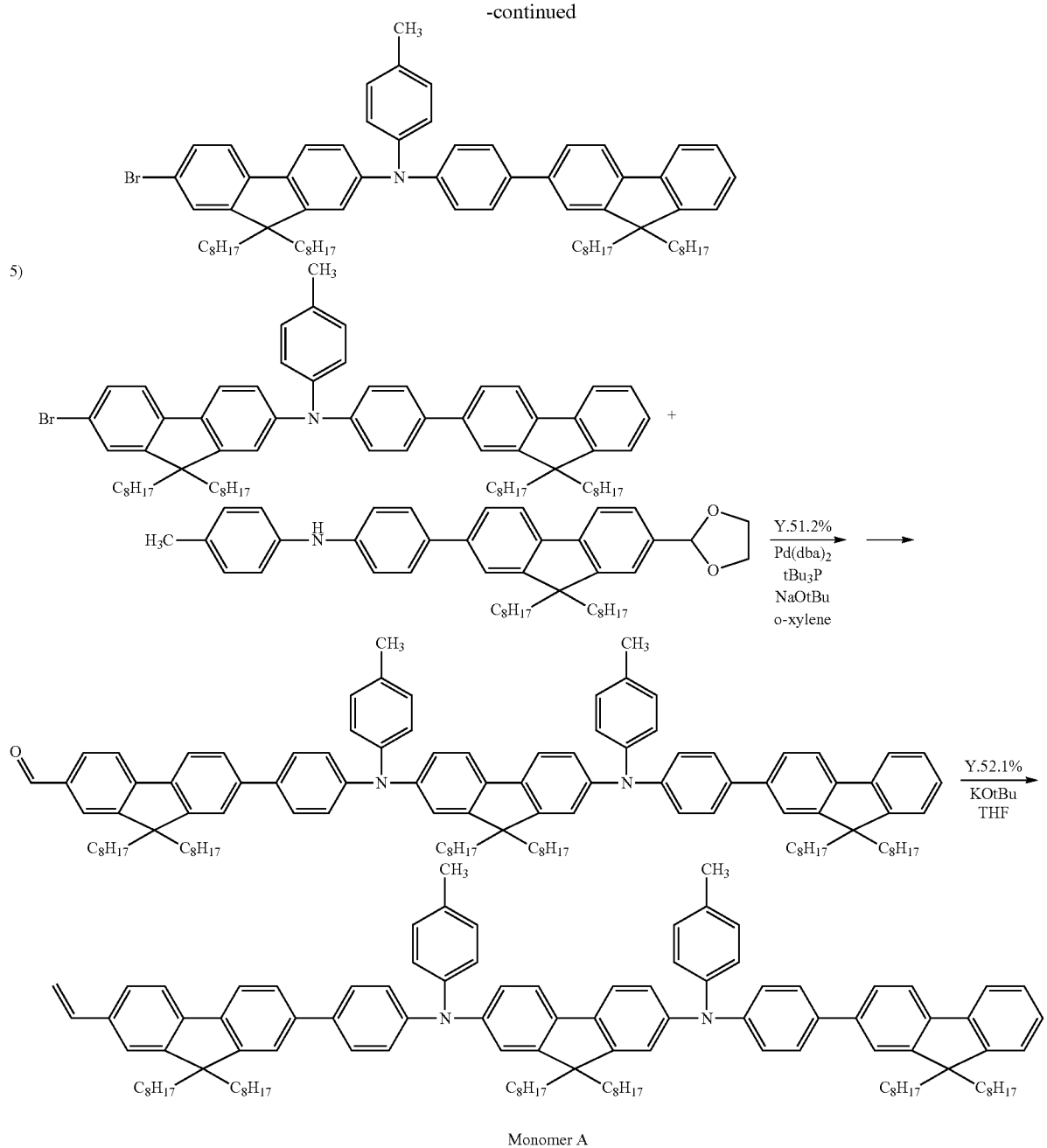
Monomer A
TABLE 1
| | Hole transport layer | Mn | Mw | Tg(° C.) | Layer stability | Current efficiency | Emission lifespan |
|---|---|---|---|---|---|---|---|
| Example 1 | polymer A | 29,100 | 79,100 | 206 | ○ | 118 | 1,260 |
| Example 2 | polymer B | 125,500 | 425,700 | 89 | ○ | 123 | 1,540 |
| Example 3 | polymer C | 27,000 | 69,000 | 108 | ○ | 121 | 1,980 |
| Comparative Example 1 | polymer a | 24,700 | 64,100 | 151 | ○ | 110 | 100 |
| Comparative Example 2 | polymer b | 77,100 | 178,000 | 63 | X | — | — |

Referring to the results in Table 1, each of the organic light-emitting devices of Examples 1 to 3 using copolymers according to embodiments had a high glass transition temperature and improved layer stability, as compared with the organic light-emitting device of Comparative Example 2.

The organic light-emitting devices of Examples 1 to 3 using the copolymers according to embodiments as hole transport layer material were found to have improved performance in terms of current efficiency and emission lifespan.

Based on the above results, it is found that a copolymer according to any of the embodiments may be effectively used with a solution coating method, and may improve the current efficiency and emission lifespan of an organic light-emitting device.

As described above, according to the one or more embodiments, an organic light-emitting device including a copolymer according to any of the above-described embodiments may have improved emission lifespan.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims.

What is claimed is:

1. A copolymer comprising a unit represented by Formula 1 and a unit represented by Formula 2:

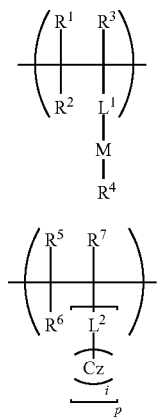

Formula 1

Formula 2 wherein, in Formulae 1 and 2, $R^1$ to $R^7$ each independently are selected from a hydrogen, a deuterium, a halogen atom, a hydroxyl group, an amino group, a nitro group, a cyano group; a substituted or unsubstituted silyl group; a substituted or unsubstituted C1-C20 alkyl group; a substituted or unsubstituted C3-C16 cyclo alkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; and a substituted or unsubstituted C6-C30 arylamino group, $L^1$ is selected from a single bond, a substituted or unsubstituted C1-C20 alkylene group; a substituted or unsubstituted C3-C30 cycloalkylene group; a substituted or unsubstituted C10-C30 arylene group; a substituted or unsubstituted C1-C30 heteroarylene group; a substituted or unsubstituted divalent alkylamino group; a substituted or unsubstituted divalent arylamino group, and a combination thereof, $L^2$ is selected from a single bond, a substituted or unsubstituted C1-C20 alkylene group; a substituted or unsubstituted C3-C30 cycloalkylene group; a substituted or unsubstituted C6-C30 arylene group; a substituted or unsubstituted C1-C30 heteroarylene group; a substituted or unsubstituted divalent alkylamino group; a substituted or unsubstituted divalent arylamino group, and a combination thereof, Cz is a group comprising a carbazole ring system or aza carbazole ring system, i is an integer from 1 to 20, M is a group represented by $-(A-B)_n-A_m-$ or $-(B-A)_n-B_m-$, n is an integer from 1 to 20, m is an integer from 0 to 10, p is an integer from 1 to 10, A is a group comprising a fluorene ring system or an aza fluorene ring system, and B is a group represented by Formula 3,

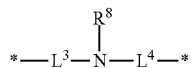

Formula 3 wherein, in Formula 3, $L^3$ and $L^4$ each independently are selected from a single bond, a substituted or unsubstituted C1-C20 alkylene group; a substituted or unsubstituted C3-C16 cycloalkylene group; a substituted or unsubstituted C6-C30 arylene group; a substituted or unsubstituted C1-C20 oxyalkylene group; a substituted or unsubstituted C3-C16 oxycycloalkylene group; a substituted or unsubstituted C6-C30 oxyarylene group; a substituted or unsubstituted C7-C40 aralkyl arylene group; a substituted or unsubstituted C6-C30 amino arylene group; a silylene group substituted with a C1-C20 alkyl group; a silylene group substituted with a C6-C30 aryl group, and a combination thereof, $R^8$ is selected from a hydrogen, a substituted or unsubstituted C1-C20 alkyl group; a substituted or unsubstituted C3-C16 cycloalkyl group; a substituted or unsubstituted C6-C30 aryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; and a substituted or unsubstituted C6-C30 arylamino group, wherein $R^8$ optionally forms a ring by binding with $L^3$ or $L^4$, and

* is a binding site with an adjacent atom.

2. The copolymer of claim 1, wherein A is a group represented by Formula 4, in which any two of $R^9$ to $R^{12}$ are bound to adjacent atoms:

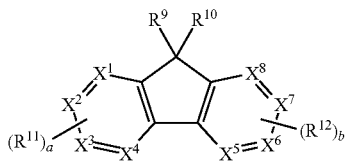

Formula 4 wherein, in Formula 4,
$R^9$ to $R^{12}$ each independently are selected from a hydrogen, a halogen atom, a hydroxyl group, an amino group, a nitro group, a cyano group; a substituted or unsubstituted silyl group; a substituted or unsubstituted C1-C20 alkyl group; a substituted or unsubstituted C3-C16 cycloalkyl group; a substituted or unsubstituted C6-C30 aryl group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group; a substituted or unsubstituted C6-C30 arylamino group, and a substituted or unsubstituted C6-C30 arylsulfonyl group, wherein any two adjacent groups selected from $R^9$ to $R^{12}$ optionally form a ring,
a and b each independently are an integer from 1 to 4, and
$X^1$ to $X^8$ each independently are CH or N.

3. The copolymer of claim 2, wherein $X^1$ to $X^8$ are CH.

4. The copolymer of claim 2, wherein $R^9$ and $R^{1o}$ each independently are a hydrogen, a substituted or unsubstituted C1-C20 alkyl group, and a substituted or unsubstituted C6-C30 aryl group.

5. The copolymer of claim 1, wherein $L^1$ is selected from a single bond, a substituted or unsubstituted C5-C30 cycloalkylene group; a substituted or unsubstituted C10-C30 arylene group, and a substituted or unsubstituted C1-C30 heteroarylene group.

6. The copolymer of claim 1, wherein $L^1$ is a single bond, a substituted or unsubstituted naphthylene group, or a substituted or unsubstituted norbornylene group.

7. The copolymer of claim 1, wherein $L^2$ is selected from a single bond, a substituted or unsubstituted C5-C30 cycloalkylene group; a substituted or unsubstituted C6-C30 arylene group; and a substituted or unsubstituted C1-C30 heteroarylene group.

8. The copolymer of claim 1, wherein $L^2$ is a single bond, or a substituted or unsubstituted fluorenylene group.

9. The copolymer of claim 1, wherein Cz is represented by Formula 5, in which any two of $R^{13}$ to $R^{15}$ are bound to an adjacent atom:

Formula 5

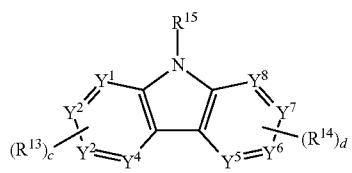

wherein, in Formula 5,
$Y^1$ to $Y^8$ each independently are CH or N,
$R^{13}$ to $R^{15}$ each independently are a hydrogen, a halogen atom, a hydroxyl group, an amino group, a nitro group, a cyano group; a substituted or unsubstituted silyl group;
a substituted or unsubstituted C1-C20 alkyl group; a substituted or unsubstituted C1-C20 amino alkyl group; a substituted or unsubstituted C3-C16 cycloalkyl group; a substituted or unsubstituted C6-C30 aryl group; a substituted or unsubstituted C6-C30 amino aryl group; a substituted or unsubstituted C1-C30 heteroaryl group; a substituted or unsubstituted C1-C20 alkoxy group; a substituted or unsubstituted C3-C16 cyclo alkoxy group; a substituted or unsubstituted C6-C30 aryloxy group; a substituted or unsubstituted C7-C40 aralkyl group; a substituted or unsubstituted C2-C40 heteroaralkyl group; a substituted or unsubstituted C1-C20 alkylamino group, or a substituted or unsubstituted C6-C30 arylamino group, wherein any two adjacent groups selected from $R^{13}$ to $R^{15}$ optionally form a ring, and c and d each independently are an integer from 0 to 4.

10. The copolymer of claim 9, wherein Cz is represented by Formula 6 or Formula 7, in which any one of $R^{13}$ and $R^{14}$ is bound to an adjacent atom:

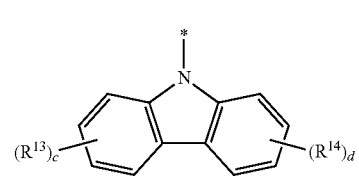

Formula 6

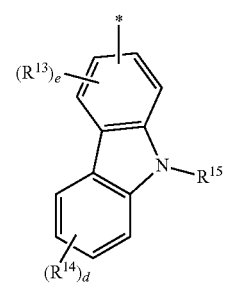

Formula 7

Formula 8

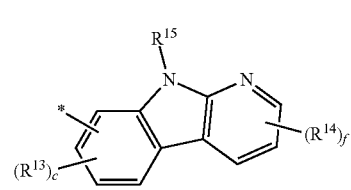

Formula 9

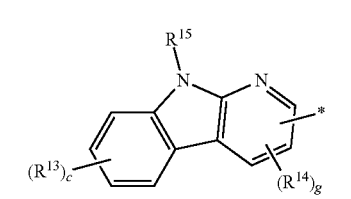

Formula 10

Formula 11

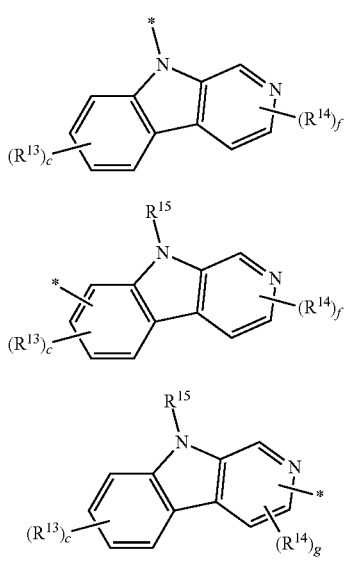

Formula 12

Formula 13

Formula 14

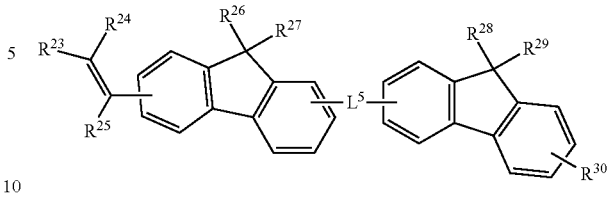

wherein, in Formula 14,
$R^{23}$ to $R^{25}$ each independently are selected from a hydrogen; a substituted or unsubstituted C1-C10 alkyl group; and a substituted or unsubstituted C6-C30 aryl group,
$R^{26}$ to $R^{30}$ each independently are selected from a hydrogen, a halogen atom, a hydroxyl group, an amino group, a nitro group, a cyano group; a substituted or unsubstituted silyl group; a substituted or unsubstituted C1-C10 alkyl group; a substituted or unsubstituted C3-C16 cycloalkyl group; a substituted or unsubstituted C6-C30 aryl group; a substituted or unsubstituted C1-C20 alkoxy group; a substituted or unsubstituted C6-C30 aryloxy group; a substituted or unsubstituted C7-C40 aralkyl group; a substituted or unsubstituted C1-C30 heteroaryl group; a substituted or unsubstituted C2-C40 heteroaralkyl group; a substituted or unsubstituted C1-C20 alkylamino group, and a substituted or unsubstituted C6-C30 arylamino group, wherein any two adjacent groups selected from $R^{26}$ to $R^{30}$ optionally form a ring,
$L^5$ is selected from a single bond, a substituted or unsubstituted C1-C20 alkylene group; a substituted or unsubstituted C3-C16 cycloalkylene group; a substituted or unsubstituted C6-C30 arylene group; a substituted or unsubstituted C1-C20 oxyalkylene group; a substituted or unsubstituted C3-C16 oxycycloalkylene group; a substituted or unsubstituted C6-C30 oxyarylene group; a substituted or unsubstituted C7-C40 aralkylene group; a substituted or unsubstituted C1-C30 heteroarylene group; a substituted or unsubstituted C6-C30 amino arylene group; a silylene group substituted with a C1-C20 alkyl group, a silylene group substituted with a C6-C30 aryl group, and a combination thereof, and
at least one of $R^{26}$ to $R^{30}$ is selected from the cross-linking groups.

wherein, in Formula 6 to Formula 13,
$R^{13}$ to $R^{15}$, c, and d are the same as in Formula 5,
e and f each independently are an integer from 0 to 3,
g is an integer from 0 to 2, and
* is a binding site with an adjacent atom.

11. The copolymer of claim 1, further comprising a polymerizable comonomer, and the polymerizable comonomer comprises at least one of cross-linking groups represented by the following formulae:

Cross-linking groups

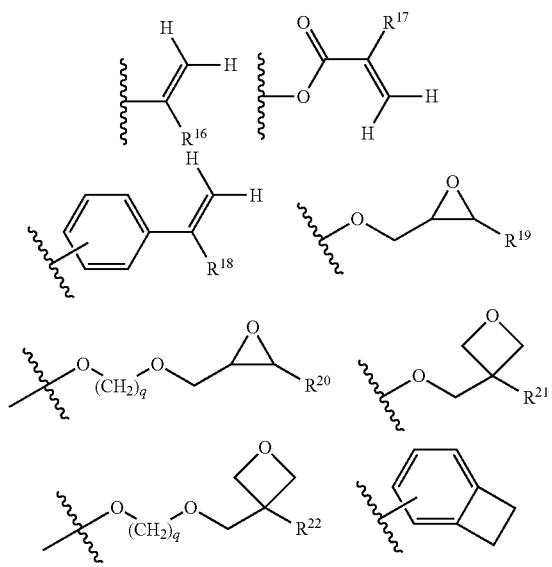

wherein, in the above formulae of the cross-linking groups,
$R^{16}$ to $R^{22}$ each independently are hydrogen; or a substituted or unsubstituted C1-C10 alkyl group, and
q is an integer from 1 to 10.

12. The copolymer of claim 11, wherein the polymerizable comonomer is a compound represented by Formula 14:

13. The copolymer of claim 12, wherein $L^5$ is represented by Formula 15:

Formula 15

$$*-[B'-A']_r-*$$

wherein, in Formula 15,
A' is represented by Formula 3, and
B' comprises a fluorene ring system or an aza fluorene ring system,
r is an integer from 1 to 20, and
* is a binding site with an adjacent atom.

14. The copolymer of claim 12, wherein $L^5$ is represented by Formula 3.

15. The copolymer of claim 1, wherein the copolymer has a number average molecular weight of about 10,000 to about 100,000 Daltons.

16. An organic light-emitting device comprising:
a first electrode;
a second electrode; and
an organic layer disposed between the first electrode and the second electrode, wherein the organic layer comprises the copolymer of claim 1.

17. The organic light-emitting device of claim 16, wherein the organic layer comprises at least one layer, and wherein the at least one layer is a hole transport layer comprising the copolymer.

18. The organic light-emitting device of claim 17, wherein the organic layer further comprises at least one layer that is an emission layer comprising a light-emitting material which ensures emission from triplet excitons.

19. An organic light-emitting device material comprising the copolymer of claim 1.

20. The organic light-emitting device material of claim 19, further comprising a solvent.

* * * * *